(12) United States Patent
Chandrasekaran et al.

(10) Patent No.: US 11,297,406 B2
(45) Date of Patent: Apr. 5, 2022

(54) ACOUSTIC TRANSDUCERS WITH A LOW PRESSURE ZONE AND DIAPHRAGMS HAVING A PRESSURE SENSOR

(71) Applicant: Knowles Electronics, LLC, Itasca, IL (US)

(72) Inventors: Venkataraman Chandrasekaran, Chicago, IL (US); Michael Kuntzman, Chicago, IL (US); Michael Pedersen, Long Grove, IL (US); Sung Bok Lee, Chicago, IL (US)

(73) Assignee: Knowles Electronics, LLC, Itasca, IL (US)

( * ) Notice: Subject to any disclaimer, the term of this patent is extended or adjusted under 35 U.S.C. 154(b) by 0 days.

(21) Appl. No.: 17/127,794

(22) Filed: Dec. 18, 2020

(65) Prior Publication Data

US 2021/0204048 A1    Jul. 1, 2021

Related U.S. Application Data

(60) Provisional application No. 62/954,236, filed on Dec. 27, 2019.

(51) Int. Cl.
| | |
|---|---|
| *H04R 1/00* | (2006.01) |
| *H04R 1/04* | (2006.01) |
| *H04R 19/04* | (2006.01) |
| *H04R 7/02* | (2006.01) |
| *B81B 3/00* | (2006.01) |
| *B81B 7/02* | (2006.01) |
| *G01L 21/12* | (2006.01) |

(52) U.S. Cl.
CPC ............. *H04R 1/04* (2013.01); *B81B 3/0021* (2013.01); *B81B 7/02* (2013.01); *G01L 21/12* (2013.01); *H04R 7/02* (2013.01); *H04R 19/04* (2013.01); *B81B 2201/0257* (2013.01); *B81B 2201/0264* (2013.01); *B81B 2203/019* (2013.01); *B81B 2203/0127* (2013.01); *B81B 2203/04* (2013.01); *H04R 2201/003* (2013.01)

(58) Field of Classification Search
CPC . H04R 1/04; H04R 7/02; H04R 19/04; H04R 2201/003; H04R 3/00; H04R 19/005; H04R 2203/00; B81B 3/0021; B81B 7/02; B81B 2201/0257; B81B 2201/0264; B81B 2203/0127; B81B 2203/019; B81B 2203/04; G01L 21/12
See application file for complete search history.

(56) References Cited

U.S. PATENT DOCUMENTS

| | | | |
|---|---|---|---|
| 9,181,080 B2* | 11/2015 | Dehe | B81B 3/0021 |
| 2017/0230758 A1* | 8/2017 | Kuntzman | H04R 1/2873 |
| 2017/0347174 A1* | 11/2017 | Chandrasekaran | H04R 19/005 |
| 2019/0007759 A1* | 1/2019 | Meisel | H04R 1/04 |

* cited by examiner

*Primary Examiner* — Matthew A Eason
(74) *Attorney, Agent, or Firm* — Loppnow & Chapa; Matthew C. Loppnow

(57) ABSTRACT

Acoustic transducers for generating electrical signals in response to acoustic signals are disclosed. In some embodiments, an acoustic transducer includes an at least partially evacuated hermetically sealed cavity defined in part by a first diaphragm. The acoustic transducer also includes a backplate disposed at least partially within the cavity. The cavity having a pressure lower than atmospheric pressure. The acoustic transducer further includes a pressure sensor coupled to the backplate and configured to sense the pressure in the cavity.

20 Claims, 13 Drawing Sheets

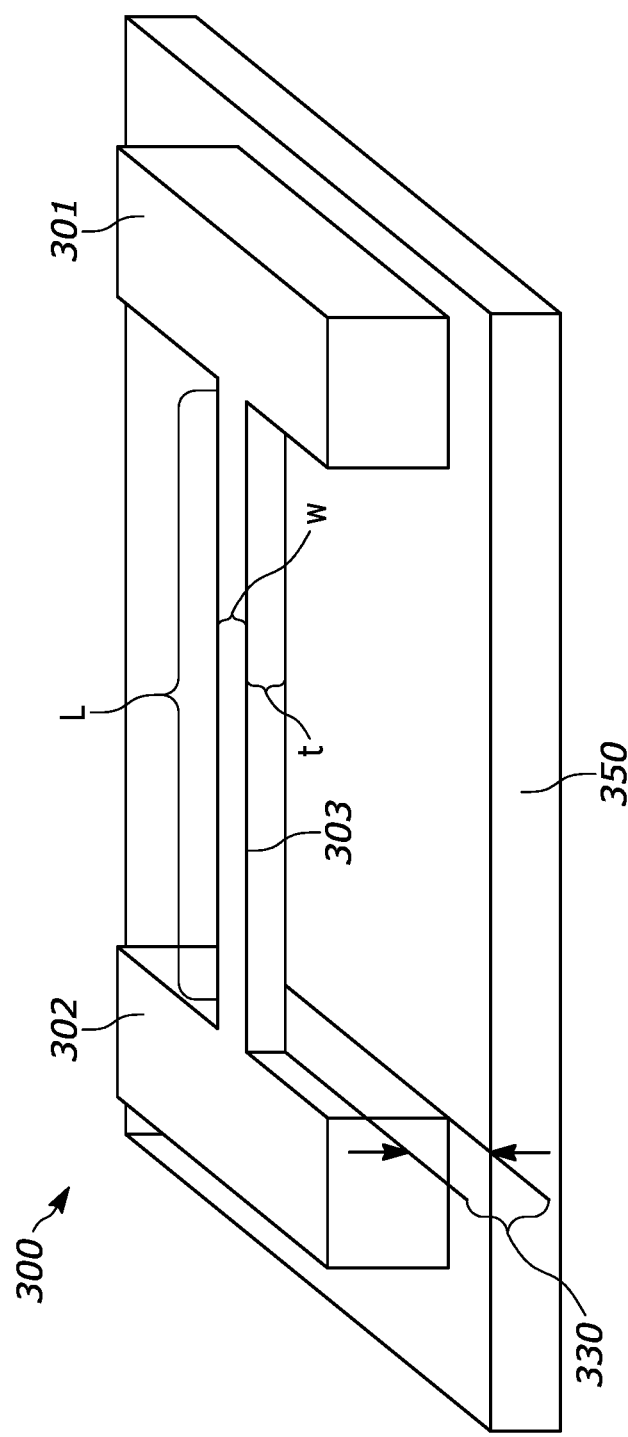
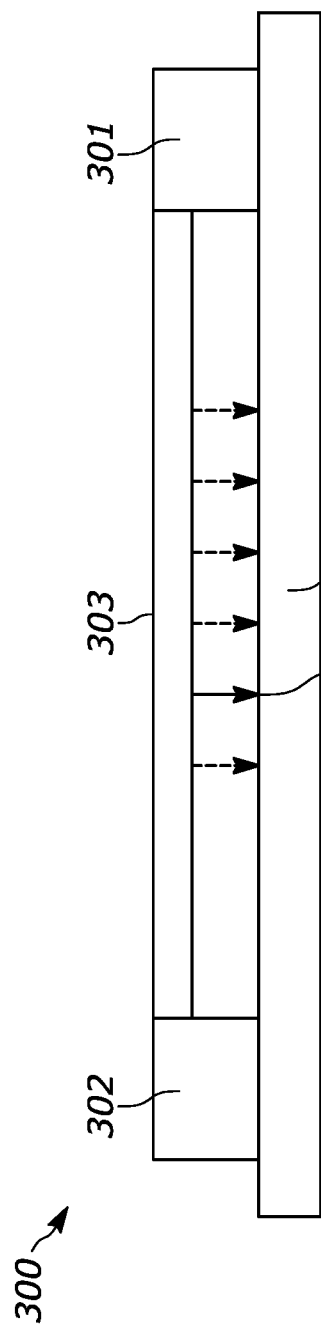
FIGURE 3a
FIGURE 3b

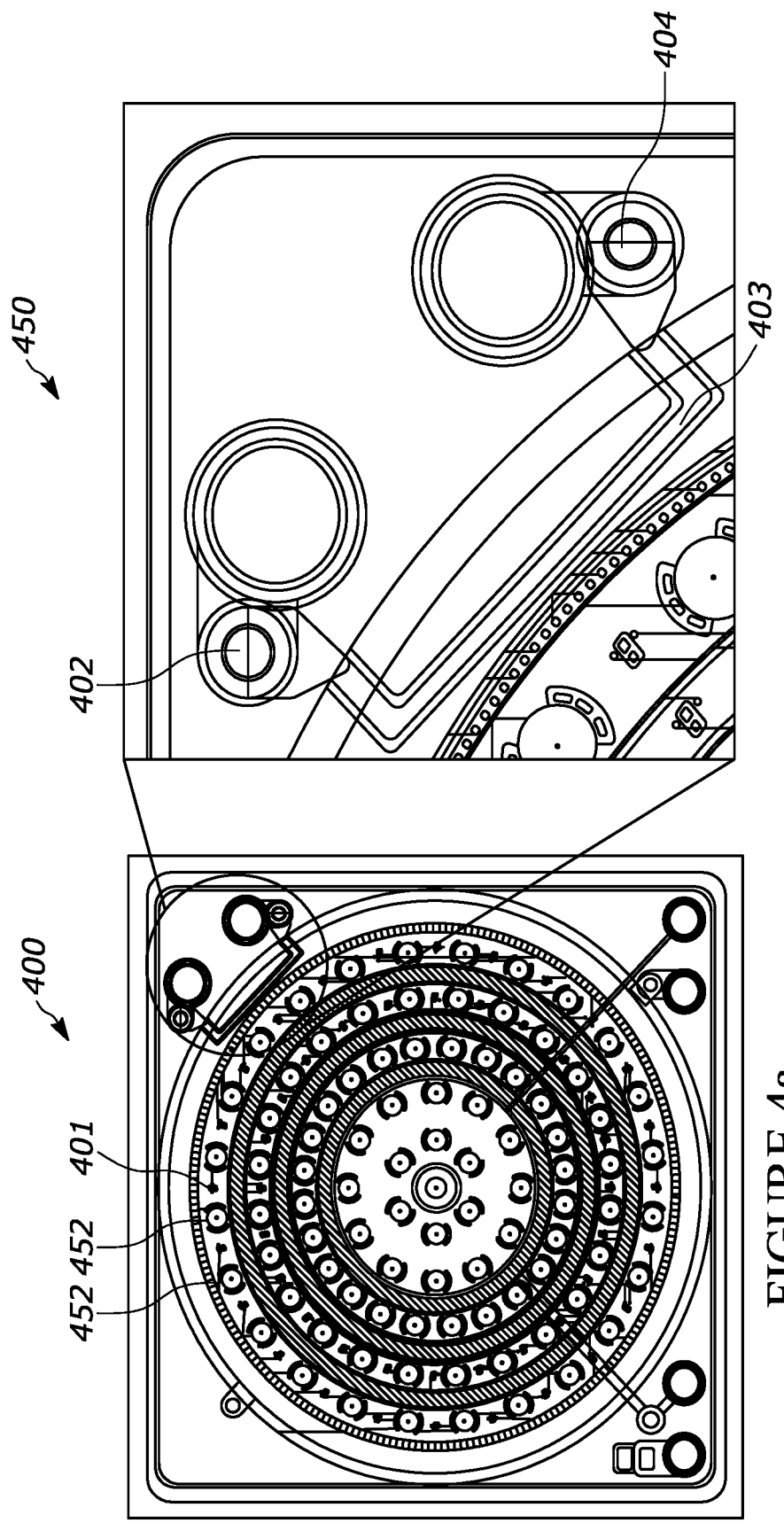

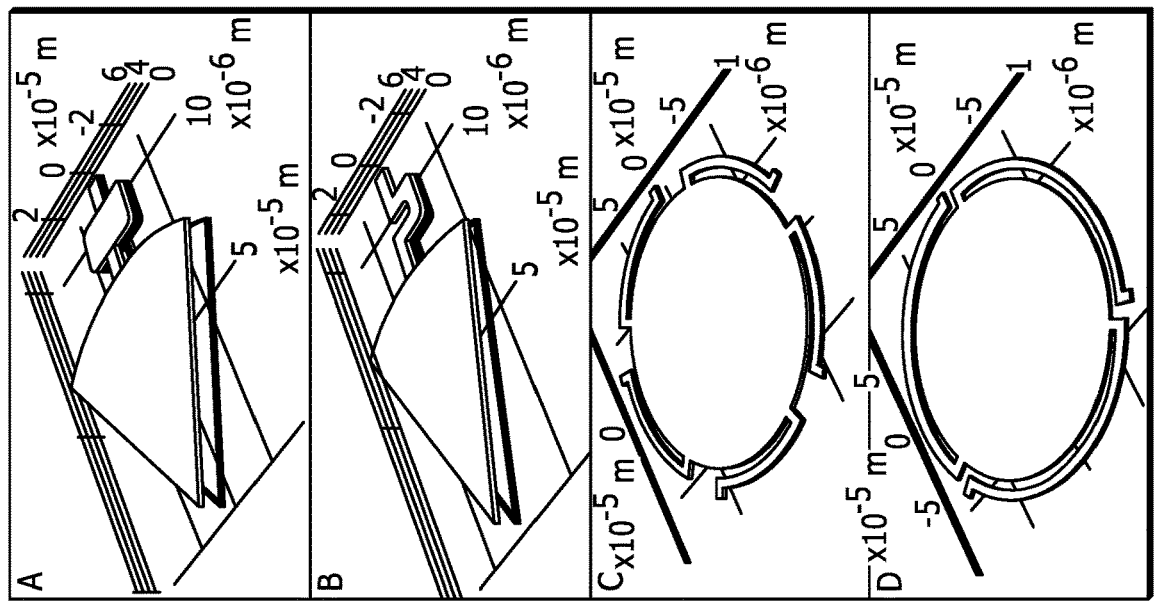
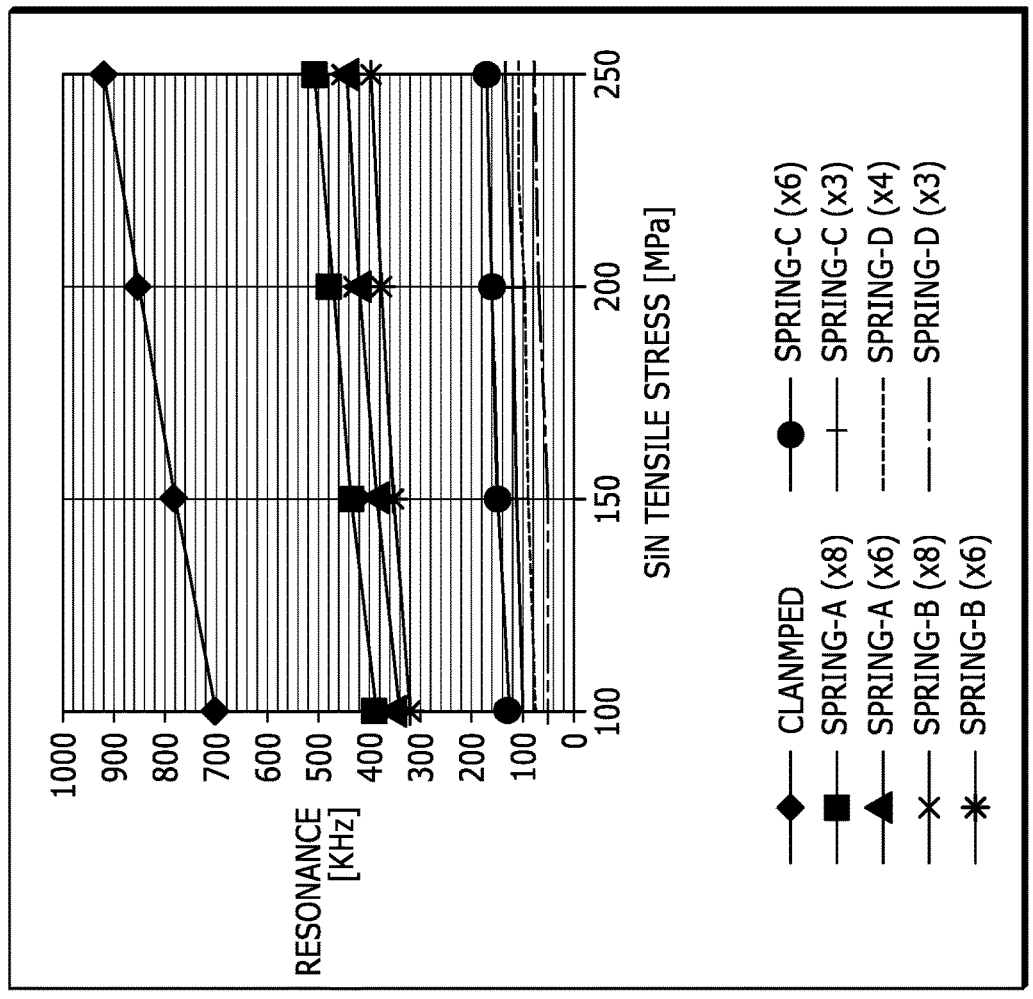
FIGURE 8f

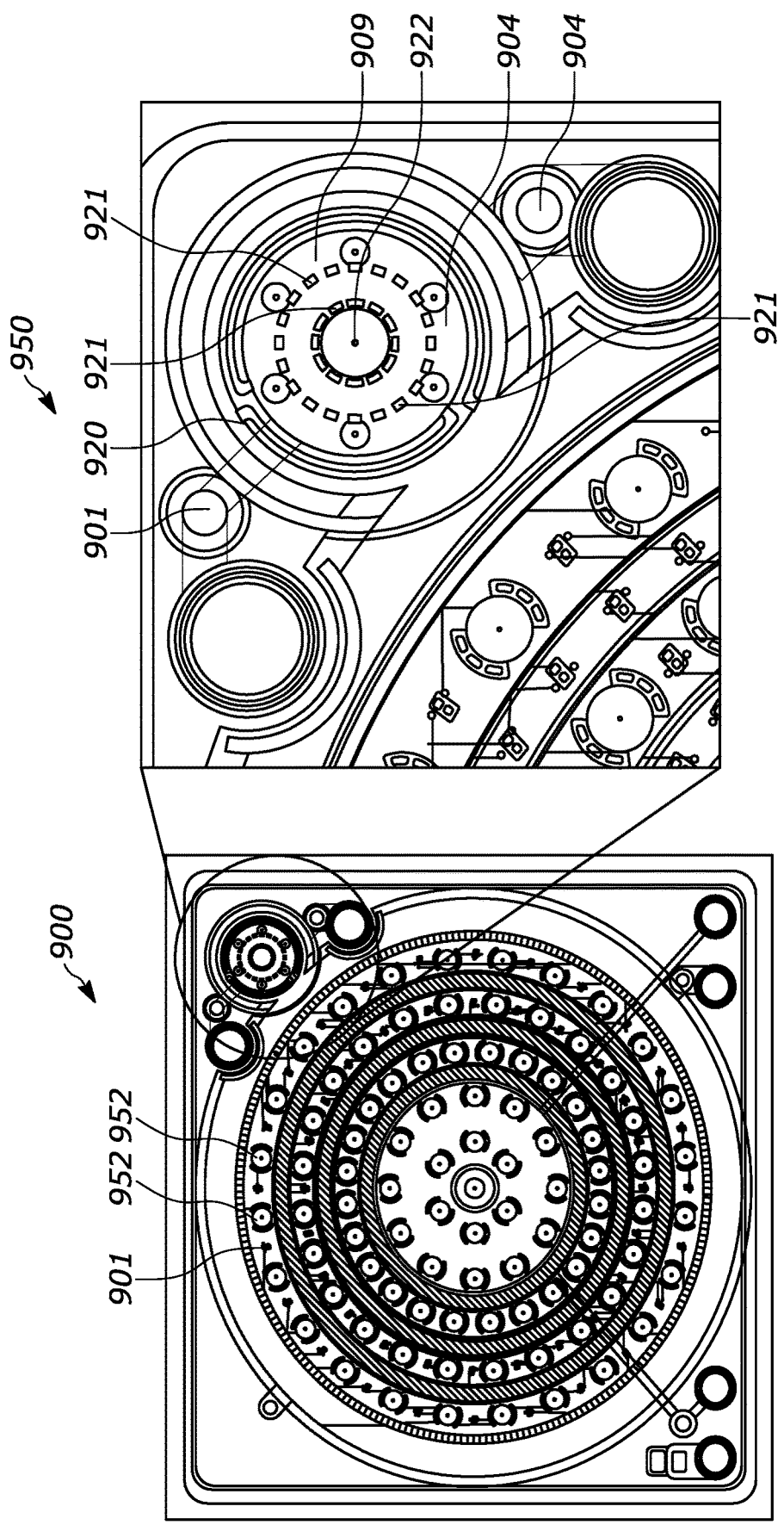

ACOUSTIC TRANSDUCERS WITH A LOW PRESSURE ZONE AND DIAPHRAGMS HAVING A PRESSURE SENSOR

CROSS-REFERENCE TO RELATED APPLICATIONS

The present application claims the priority benefit of U.S. Provisional Patent Application No. 62/954,236, filed Dec. 27, 2019, which is incorporated herein by reference.

TECHNICAL FIELD

The present disclosure relates generally to systems and methods of detecting and monitoring pressure in an evacuated cavity in which a transducer element is disposed.

BACKGROUND

Microphone assemblies used in electronic devices like mobile phones, laptop computers, hearing devices, smart speakers, and other applications generally comprise an electro-acoustic transducer and an integrated circuit disposed in a housing having a surface-mount interface for integration with the host device. Such transducers include capacitive sensors fabricated using microelectromechanical systems (MEMS) technology. Efforts to improve the performance of such transducers include forming the transduction element in a hermetically sealed cavity that is at least partially evacuated.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 3a depicts an isometric view of a Pirani gauge.

FIG. 3b depicts a side view of the Pirani gauge of FIG. 3a.

FIG. 4a depicts a top cutaway view of an acoustic transducer.

FIG. 4b depicts and enlarged view of a portion of the transducer of FIG. 4a.

FIG. 8f depicts multiple examples of potential integrated resonator designs and the respective resonant frequency response characteristics vs tensile film stress for the multiple examples of potential integrated resonator designs.

FIG. 9a depicts a top cutaway view of a transducer.

FIG. 9b depicts and enlarged view of a portion of the transducer of FIG. 9a.

DETAILED DESCRIPTION OF VARIOUS EMBODIMENTS

Figure 1:
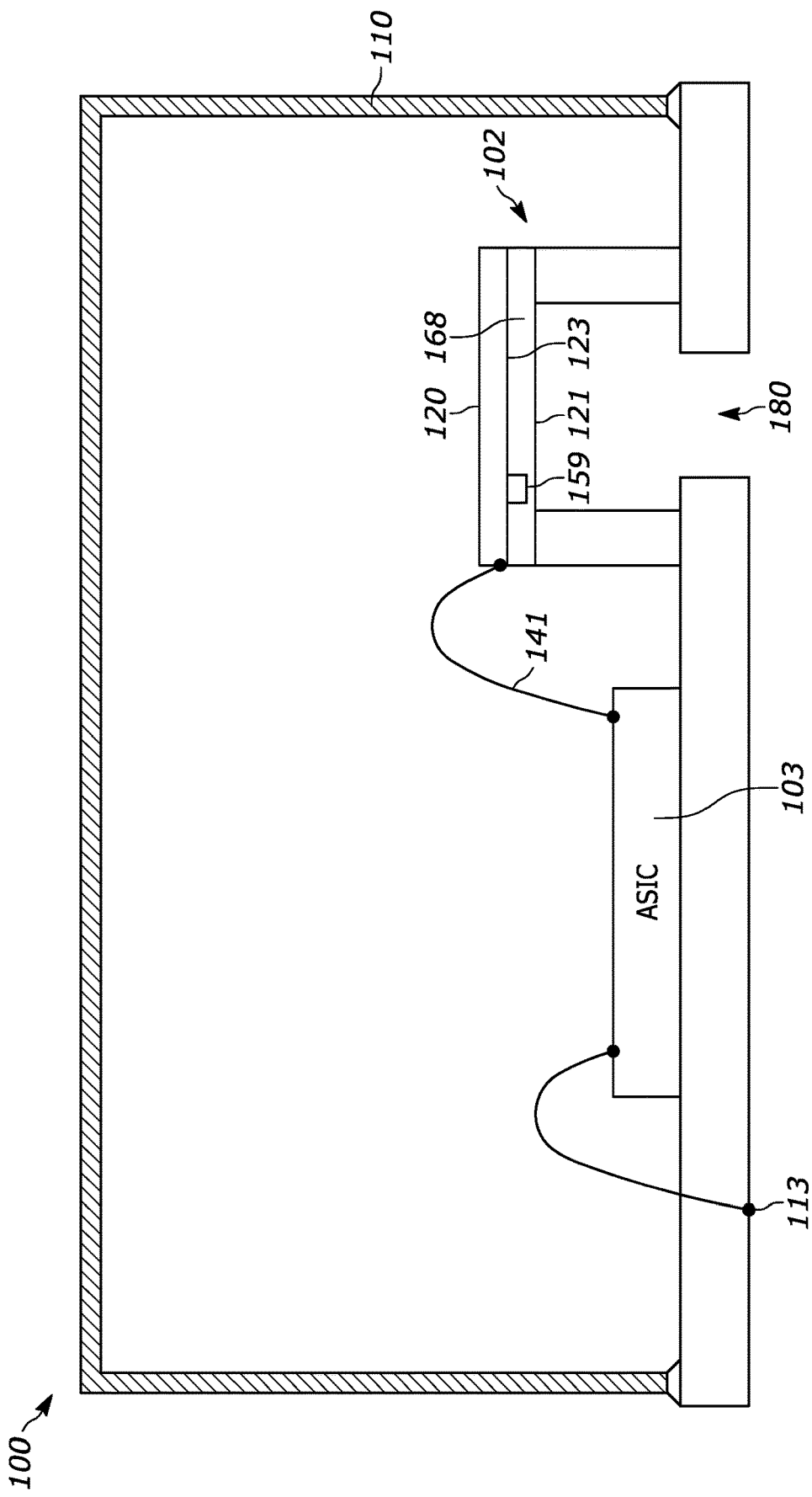
FIG. 1 is a cross-sectional view of a microphone assembly in which an electro-acoustical transducer having hermetically sealed cavity may be implemented.

Embodiments described herein relate generally to systems and methods for determining the pressure within a cavity of a transducer. In particular, some embodiments described herein relate to dual diaphragm acoustic transducers that define a hermetically sealed cavity. This application incorporates by reference U.S. application Ser. No. 16/593,263 filed on Oct. 4, 2019 entitled, "Acoustic Transducers With A Low Pressure Zone and Diaphragms Having Enhanced Compliance."

In some embodiments, dual diaphragm acoustic transducers include a first (e.g., a top) diaphragm and a second (e.g., a bottom) diaphragm with a back plate interposed therebetween. The diaphragms can be sealed under reduced pressure to create a low-pressure region (e.g., a cavity) between the top and bottom diaphragm that has a pressure substantially lower than atmospheric pressure, for example, medium vacuum in a range of approximately 100 mTorr to 100 Torr may be sufficient in many cases. The low-pressure region (e.g., cavity) substantially reduces acoustic damping of the back plate (i.e., squeeze film damping) resulting in reduced self-noise of the sensor and also allowing reduction in a gap between the diaphragms and a back plate, reduction in perforations and may allow very high sensing capacitance. Furthermore, since the volume between the top and bottom diaphragms is sealed, particles (e.g., dust, water droplets, solder or assembly debris, etc.) cannot penetrate between the diaphragms and the back plate, which is a common cause of failure in single diaphragm acoustic transducers. However, the exact sensitivity and self-noise of the sensor may be dependent upon the actual pressure within the cavity (e.g., low-pressure region). Furthermore, the pressure within the low-pressure region may change over time due to leakages, temperature, or elevation and may cause the specifications of the transducer to change as a result of the change of pressure in the low-pressure region (e.g., cavity). If the pressure within the low-pressure region (e.g., cavity) can be determined throughout the lifetime of the transducer, then exact specifications of the transducer (e.g., sensitivity of the transducer) may be continuously or intermittently be adjusted for. The ability to determine the pressure within the cavity also aids designers and technicians in analyzing the cause of failure of devices showing atypical performance and provides insight useful for improving future iterations of the design and/or fabrication process.

As described herein, the term "unanchored" when used in conjunction with posts refers to posts which extend from one diaphragm to another diaphragm of a dual diaphragm acoustic transducer such that a gap or space exists between a tip of the post and the respective diaphragm proximate to the tip. Contact of the tip with the respective diaphragm is only made when a sufficiently high force or pressure acts on one or both the diaphragms (e.g., ambient pressure or electrostatic force due to bias) such that the unanchored posts can both slide and rotate relative to the respective diaphragm.

As described herein, the term "non-rigidly connected" when used in conjunction with posts refers to posts which extend from one diaphragm to another diaphragm of a dual diaphragm acoustic transducer such that a tip of the post is in permanent contact with the opposing diaphragm so as to allow bending or rotation of the post near or proximate to the point of contact.

FIG. 1 is a cross-sectional view of a microphone assembly 100 in which an electro-acoustical transducer 102 having hermetically sealed cavity is implemented. The microphone assembly 100 generally includes an electro-acoustic transducer 102 coupled to an electric circuit 103 disposed within a housing 110. The transducer 102 is configured to generate an electrical signal in response to sensing acoustic activity. The transducer 102 may be a capacitive, piezoelectric or other transduction device implemented using microelectromechanical systems (MEMS) fabrication or other known or future technology. The transducer may be a dual diaphragm acoustic transducer that include a first (e.g., a top) diaphragm 120 and a second (e.g., a bottom) diaphragm 121 with a back plate 123 interposed therebetween. In some embodiments, the backplate 123 may have a pressure sensor 159 disposed thereon. In some embodiments, the backplate 123 may be configured to act as a pressure sensor when in a first state. In some embodiments, the backplate 123 may be formed of one single element or of multiple elements. In some embodiments, the backplate 123 includes one or more apertures therein such that the cavity 168 is connected between the first and second diaphragms 120 and 121.

The diaphragms 120 and 121 can be sealed under reduced pressure so that the cavity 168 constitutes a low pressure region between the top and bottom diaphragm 120 and 121, which has a pressure substantially lower than atmospheric pressure, for example, medium vacuum in a range of approximately 100 mTorr to 100 Torr may be sufficient in many cases. In some embodiments, more or fewer diaphragms may be used in order to define or create the cavity 168. In some embodiments, the first and second diaphragms 120 and 121 may include one or more support structures designed to support the respective diaphragm 120 or 121 such that the cavity 168 remains defined (e.g., such that the first or second diaphragms do not collapse under the pressure differential between the cavity 168 and the space outside of the diaphragms).

The electrical circuit 103 may be embodied by one or more integrated circuits, for example, an application specific integrated circuit (ASIC) with analog and digital circuits and a discrete digital signal processor (DSP) that performs audio processing (e.g., keyword/command detection, noise suppression, authentication . . . ). The electrical circuit 103 may also include a pressure sensing circuit that is connected to the backplate 123 and/or the pressure sensor 159 and configured to determine or assist in determining a pressure within the cavity 168 The housing 110 may include a sound port 180 and an external device interface 113 with contacts (e.g., for power, data, ground, control, external signals etc.) to which the electrical circuit is coupled. The external device interface 113 is configured for surface or other mounting to a host device (e.g., by reflow soldering). In some embodiments, the host device may be an amplification device configured to amplify and project an audio signal using the electrical signal generated by the transducer.

In FIG. 1, the electric circuit 103 receives an electrical signal generated by the electro-acoustic transducer via connection 141. The signal from the transducer 102 can be processed into an output signal representative of the sensed acoustic activity by the electric circuit 103. The electric circuit 103 may include a signal conditioning circuit, clock circuit, a direct current (DC) bias circuit, one or more low pass filters, and a controller, examples of which are described below. In some embodiments, a DC bias is applied to a first terminal of the transducer via connection 141. In some embodiments, the signal conditioning circuit is configured to condition an electrical signal obtained from the transducer when the circuit is coupled to the transducer. In some embodiments, the electric circuit includes one or more processors coupled to a non-transitory computer readable medium that is configured to store executable instructions thereon. The executable instructions are designed to, when executed by the one or more processors to cause them to complete or perform any of the operations, processes, or methods described herein.

Figure 2:
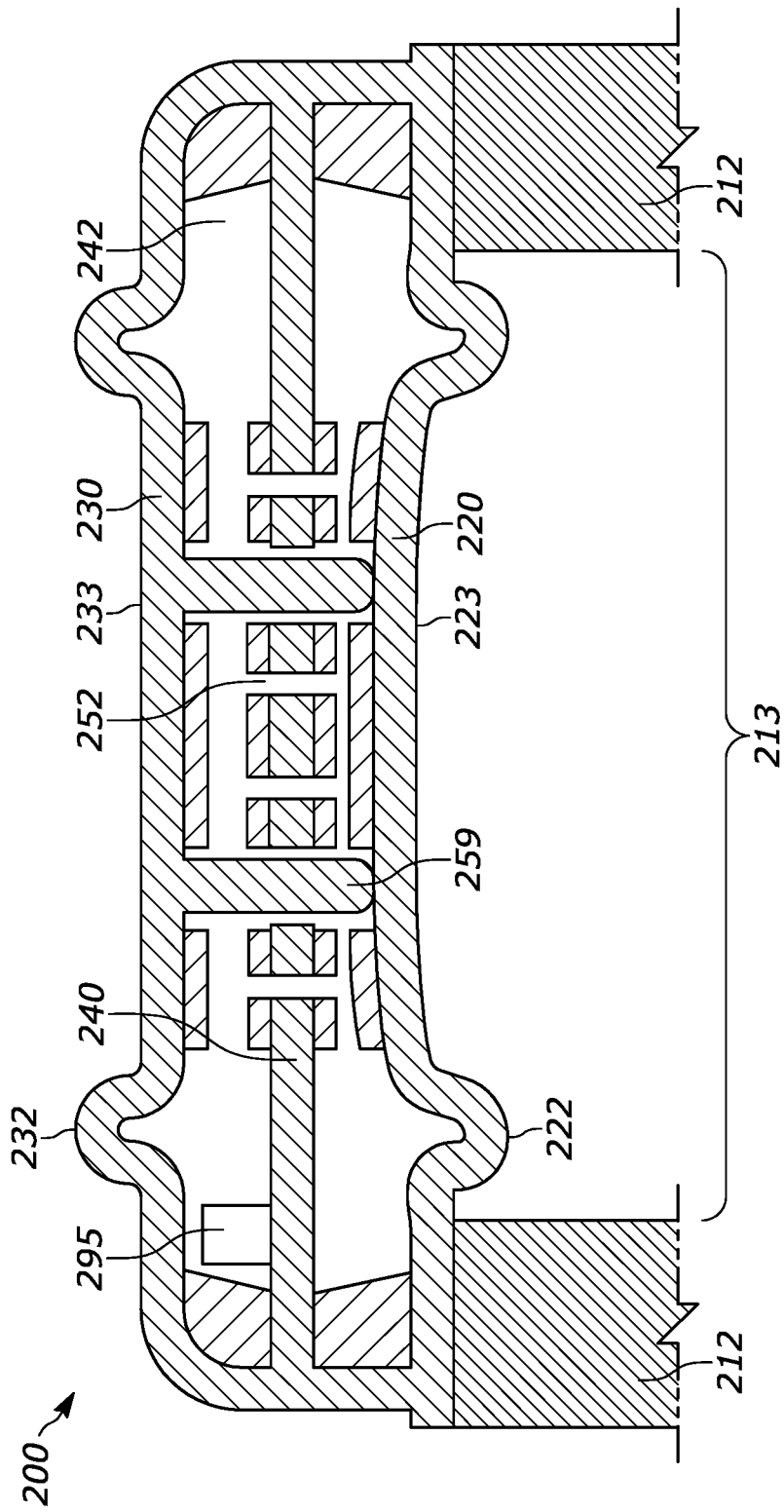
FIG. 2 is a side cross-section view of an acoustic transducer.

FIG. 2 is a side cross-section view of an acoustic transducer 200. In some embodiments, the acoustic transducer 200 may be similar to or implemented as the transducer 102 as discussed in reference to FIG. 1. The acoustic transducer 200 may be implemented as, for example, a MEMS acoustic transducer for use in a MEMS microphone assembly, a MEMS pressure sensor, or combinations thereof. The acoustic transducer 200 is configured to generate electrical signals responsive to acoustic signals or atmospheric pressure changes.

The acoustic transducer 200 includes a substrate 212 defining a first opening 213 therein. In some embodiments, the first opening 213 may be similar to the port 180 described in reference to FIG. 1. In some embodiments, the substrate 212 may be formed from silicon, glass, ceramics, or any other suitable material.

The acoustic transducer 200 includes a bottom or first diaphragm 220, a top or second diaphragm 230 and a back plate 240 located between the first diaphragm 220 and the second diaphragm 230. In some embodiments, the first diaphragm 220 and the second diaphragm 230 define a cavity 242 (e.g., a low-pressure area). In other embodiments, additional or fewer elements (e.g., diaphragms, plates, substrates, etc.) may be used in order to define the cavity 242. Each of the first diaphragm 220, the second diaphragm 230 and the backplate 240 are disposed on or coupled to the substrate 212. At least a portion of the first diaphragm 220 may be disposed on a support structure (not shown). In some embodiments, a portion of radial edges of one or more of the first diaphragm 220, the second diaphragm 230 and the back plate 240 may be embedded within a support structure that connects the substrate to one or more respective elements during a fabrication process of the acoustic transducer 200.

The diaphragms 220 and 230 may be formed from a conductive material or a sandwiched layer of conductive and insulative materials. Materials used for forming the diaphragms 220 and 230 may include, for example, silicon, silicon oxide, silicon nitride, silicon carbide, gold, aluminum, platinum, etc. Vibrations of the diaphragms 220, 230 (e.g., out of phase vibrations) relative to the backplate 240 which is substantially fixed (e.g., substantially inflexible relative to the diaphragms 220, 230) in response to acoustic signals received on one of the first or second diaphragms 220 and 230 causes changes in the capacitance between the diaphragms 220 and 230, and the back plate 240, and corresponding changes in the generated electrical signal.

In other embodiments, at least a portion of the first diaphragm 220 and the second diaphragm 230 may be formed using a piezoelectric material, for example, quartz, lead titanate, III-V and II-VI semi-conductors (e.g., gallium nitride, indium nitride, aluminum nitride, zinc oxide, etc.), graphene, ultra nanocrystalline diamond, polymers (e.g., polyvinylidene fluoride) or any other suitable piezoelectric material. For example, the piezoelectric material may be deposited as a ring around the first or second diaphragm 220 or 230 perimeter on top of the base material forming the diaphragms 220 and 230 (e.g., silicon nitride or polysilicon). In such embodiments, vibration of the diaphragms 220, 230 in response to the acoustic signal may generate an electrical signal (e.g., a piezoelectric current or voltage) which is representative of the acoustic signal. When operated as a pressure sensor, inwards displacement of the each of the diaphragms 220 and 230 towards each other with increasing ambient pressure or outwards displacement away from each other with decreasing ambient pressure generates an electrical signal corresponding to the atmospheric pressure. In various embodiments, the first and second diaphragms 220, 230 may be formed from low stress silicon nitride (LSN), or any other suitable material (e.g., silicon oxide, silicon, silicon carbide, ceramics, etc.). Furthermore, the back plate 240 may be formed from polysilicon (poly) and silicon nitride, or any other suitable material (e.g., silicon oxide, silicon, ceramics, etc.).

Outer surfaces 223 and 233 of each of the first diaphragm 220 and the second diaphragm 230 are exposed to atmosphere, for example, atmospheric air. The second diaphragm 230 is spaced apart from the first diaphragm 220 such that the cavity (or volume) 242 is formed between the first and second diaphragms 220 and 230. The cavity 242 has a pressure that is lower than atmospheric pressure, for example, in a range of 100 mTorr to 100 Torr, but in some embodiments, limiting the pressure to be in a range of 1 mTorr to 10 Torr may provide particular benefits in terms of signal to noise ratio (SNR). The back plate 240 is disposed in the cavity 242 between the first and second diaphragms 220 and 230. In some embodiments, one or more apertures 252 may be defined in the back plate 240 such that a portion of the cavity 242 located between the first diaphragm 220 and the back plate 240 is connected to a portion of the cavity 242 located between the second diaphragm 230 and the back plate 240.

In some embodiments, the backplate 240 or a portion of the backplate 240 has a pressure sensor 295 disposed thereon. The pressure sensor 295 may be configured to connect to an electrical circuit (e.g., such as the electrical circuit 103 referenced in FIG. 1) such that the pressure within the cavity 242 may be monitored. In some embodiments, the pressure sensor 295 includes electrical terminals that are formed within or designed to extend through the backplate, the first diaphragm 220, or the second diaphragm 230 and electrically couple to the electric circuitry. In some embodiments, the backplate 240 is configured to act as a pressure sensor itself. That is, in some embodiments, and as explained below in reference to FIGS. 10*a*-*b*, the backplate 240 may include two or more electric contacts such that a current can be passed through the backplate and the backplate can be used as a resonator in order to determine the pressure within the cavity 242.

In some embodiments, the large pressure differential between the atmospheric pressure acting on each of the first diaphragm 220 and the second diaphragm 230, and the low pressure in the cavity 242 causes the first diaphragm 220 and the second diaphragm 230 to be in a state of continuous tension. Thus, in some embodiments, this significantly reduces the compliance of the diaphragms 220, 230. To increase compliance, in some example embodiments, at least a first corrugation 222 and a second corrugation 232 is formed on the first diaphragm 120 and the second diaphragm 230, respectively. The first and second corrugation 222, 232 protrude outwardly from the diaphragms 220 and 230, respectively in a direction away from the back plate 240. In some embodiments, each diaphragm may include additional or fewer corrugations 222 or 232.

For example, the diaphragms 220, 230 may include one or more circumferential corrugations that serve to decrease tension in the first and second diaphragm 220 and 230, respectively and increase compliance. In some embodiments, any number of corrugations may be formed in the first and second diaphragm 220 and 230 (e.g., 2, 3 or even more corrugations located circumferentially about a longitudinal axis of the acoustic transducer 200). In various embodiments, the corrugations 222 and 232 may have a height in a range of 0.5 microns to 5 microns (e.g., 0.5, 1, 2, 3, 4 or 5 microns inclusive of all ranges and values therebetween), and a spacing between the diaphragms 220 and 230 may be in a range of 1-15 microns (e.g., 1, 3, 5, 7, 9, 12, 14 or 15 microns inclusive of all ranges and values therebetween).

Atmospheric air exerts a force on each of the first and second diaphragms 220 and 230 in a direction towards the backplate 240. Since the corrugations 222 and 232 protrude outwards from the diaphragms 220 and 230, the atmospheric pressure acting on the corrugations 222 and 232 causes the corrugations to flex axially inwards towards the back plate 240 and radially outwards. This causes a decrease in the tension of diaphragm and an increase in compliance which increases proportionally with a relative increase in atmospheric pressure. For example, in some implementations, the acoustic transducer 200 may have an acoustic compliance in the region of the diaphragms 220 and 330 which is about 2 times an acoustic compliance of a similar baseline acoustic transducer that does not include the outward protruding corrugations 222 and 232 at a pressure differential of about zero between atmospheric pressure and the pressure in the cavity 242. The compliance of the acoustic transducer 200 may increase to greater than 8 times the acoustic compliance of the baseline acoustic transducer at a pressure differential of about 100 kPa, which corresponds to a greater than 13 dB increase in acoustic compliance. In this manner, the acoustic transducer 200 has significantly higher sensitivity towards acoustic signals, or for measuring pressure changes relative to the baseline acoustic transducer.

In some embodiments, a large pressure differential between atmospheric pressure acting on each of the first diaphragm 220 and the second diaphragm 230 and the low pressure in the cavity 242 may become sufficiently large to cause the first and second diaphragm 220 and 230 to collapse. In order to prevent this from occurring, the second diaphragm 230 (or first diaphragm 240) may include one or more posts 259 extending toward the other diaphragm (e.g., through a respective aperture 252 of the backplate 240) in order to prevent the two diaphragms from collapsing or deforming in a manner that would prevent one or more of the diaphragms from operating as an acoustic sensor (e.g., in their intended manner).

In some embodiments, the acoustic transducer 200 or any other acoustic transducer described herein may be operated as a microphone and/or a pressure sensing assembly. In such embodiment, atmospheric pressure acts on both the diaphragms 220 and 230, and acoustic pressure acts on one of the diaphragms (e.g., either one of the diaphragms 220 or 230). Changes in atmospheric pressure may cause the capacitance values of each of the diaphragms 220 and 230 to change in the same direction that creates a common mode signal, which is used for pressure sensing. In some embodiments, the pressure sensor 295 may be used to determine the actual pressure within the cavity 242. This is useful because the pressure within the cavity 242 may change over time (e.g., due to leakages, elevation changes, temperature changes etc.). In some embodiments, the pressure differential may become too great (e.g., too much such that the first and second diaphragms are pushed against the one or more posts 259), and the pressure sensor 295 may be used to provide a baseline for estimating the acoustic intensity of sensed acoustic activity. In some embodiments, the pressure sensor 295 may be utilized to detect for leaks within the cavity 242. In some embodiments, the pressure sensor 295 may be utilized detect the pressure within the cavity 242 in order to determine that the transducer 200 was properly manufactured to particular specifications. In some embodiments, the pressure sensor 295 may be utilized to detect the pressure within the cavity 242 and adjust or calibrate corresponding circuitry based on the determined pressure in order to maximize the quality of electrical signals that are created from sensing acoustic energy.

FIG. 3a depicts an isometric view of a Pirani gauge 300 in accordance with an illustrative embodiment. FIG. 3b depicts a side view of the Pirani gauge 300 in accordance with an illustrative embodiment. In some embodiments, the Pirani gauge 300 may be used or implemented as the pressure sensor 295 as referenced in FIG. 2. In some embodiments, the Pirani gauge 300 may be mounted to the backplate 240 or a portion thereof. The Pirani gauge 300 may be electrically connected or coupled to pressure sensing circuitry of the electric circuit 103. The Pirani gauge 300 includes a first pad 301, a second pad 302, and a micro-beam 303. The first pad 301 is affixed, coupled to, or disposed on a rigid substrate 350 at a first location. The second pad 302 is affixed, coupled to, or disposed on the rigid substrate 350 at a second location. The micro-beam 303 has a first end that is affixed or connected to the first pad 301 and a second end that is affixed or connected to the second pad 302 such that the micro-beam is suspended a distance 330 above the rigid substrate 350. In some embodiments, the rigid substrate 350 is an element that is capable and designed to act as a heat sink. In some embodiments, the rigid substrate 350 may be configured to be disposed on or coupled to a portion of the backplate 240. In some embodiments, the rigid substrate 350 may be the backplate 240 (e.g., or the portion of the backplate 240). An inner portion (e.g., portion that connects to the micro-beam 303) of the first pad 301 is separated from an inner portion (e.g., portion that connects to the micro-beam 303) of the second pad 302 by a length l. The length l is also the length of the micro-beam 303. In some embodiments, the micro-beam 303 has a width w and a thickness t that are constant throughout the micro-beam 303.

It is to be appreciated that although the first and second pads 301 and 302 are shown as three dimensional rectangles, that, in other embodiments, the first and second pads 301 and 302 may be of any shape that allows for the pads 301 and 302 to be connected to the rigid substrate 350 and also the micro-beam 303 such that the micro-beam 303 is suspended the distance 330 above the rigid substrate 350. In some embodiments, the distance 330 which the micro-beam 303 is suspended above the rigid substrate 350 may change and be designed for application specific applications. In some embodiments, the first pad 301, the second pad 302, and the micro-beam 303 are composed of conductive elements. In some embodiments, the first pad 301 is electrically connected to the electric circuit 103 and the second pad 302 is also electrically connected to the electric circuit 103.

The Pirani gauge 300 operates by providing a current or voltage to the first pad 301 or the second pad 302 and determining the amount of resistance that is present in the micro-beam 303. For example, in some embodiments, the micro-beam 303 acts as a resistor and when a current and/or voltage is applied from the electric circuit 103 via the pads 302 and 301, the micro-beam 303 exhibits a resistance that can be determined by pressure sensing circuitry within the electric circuit 103. The resistance of the micro-beam 303 is based on the width w, length l, thickness t, and material of the micro-beam 303. However, the temperature and resistance of the beam varies with pressure due to heat conduction H through the gas between the micro-beam 303 and the rigid substrate (e.g., the rigid substrate acts as a heat sink). Thus, since the width w, length l, thickness t, and material of the micro-beam 303 are known, the pressure around the Pirani gauge can be estimated based on the sensed resistance and comparing that sensed resistance to its nominal or initial value at atmospheric pressure. In some embodiments, the backplate may have the Pirani gauge disposed thereon. In some embodiments, as explained below in reference to FIG. 10a, the backplate and one or more of the diaphragms may be used as a Pirani gauge.

FIG. 4a depicts a top cutaway view of a transducer 400 in accordance with an illustrative embodiment. FIG. 4b depicts and enlarged view of a portion of the transducer of FIG. 4a. The top cutaway view of the transducer 400 depicts a backplate 401 of the transducer. That is, the top cutaway view of the transducer 400 depicts a top view of a transducer without a second or top diaphragm for purposes of demonstration. FIG. 4b depicts an enlarged portion 450 of the transducer 400 of FIG. 4a in accordance with an illustrative embodiment. More particularly, enlarged portion 450 of the transducer 400 depicts a Pirani gauge disposed on the backplate 401.

The backplate 401 includes one or more apertures 452. In some embodiments, the one or more apertures may be similar to the one or more apertures 252 as referenced in the discussion of FIG. 2. In some embodiments, the backplate 401 is similar to the backplate 240 as referenced in the discussion of FIG. 2. The transducer 400 includes a Pirani gauge disposed on the backplate 401. In some embodiments, the Pirani gauge may be similar to the Pirani gauge discussed in reference to FIGS. 3a and 3b. In some embodiments, the Pirani gauge may be disposed on the backplate at different or alternative locations on the backplate 401 and may be formed using the same layers used to form the backplate. The Pirani gauge includes a micro-beam resistor 403 (e.g., an electrically conductive strip that is configured to carry a current) that is electrically connected between a first terminal 402 and a second terminal 404. The first and second terminals 402 and 404 are configured to or designed such that the micro-beam resistor 403 may be connected to pressure sensing circuitry.

Figure 5:
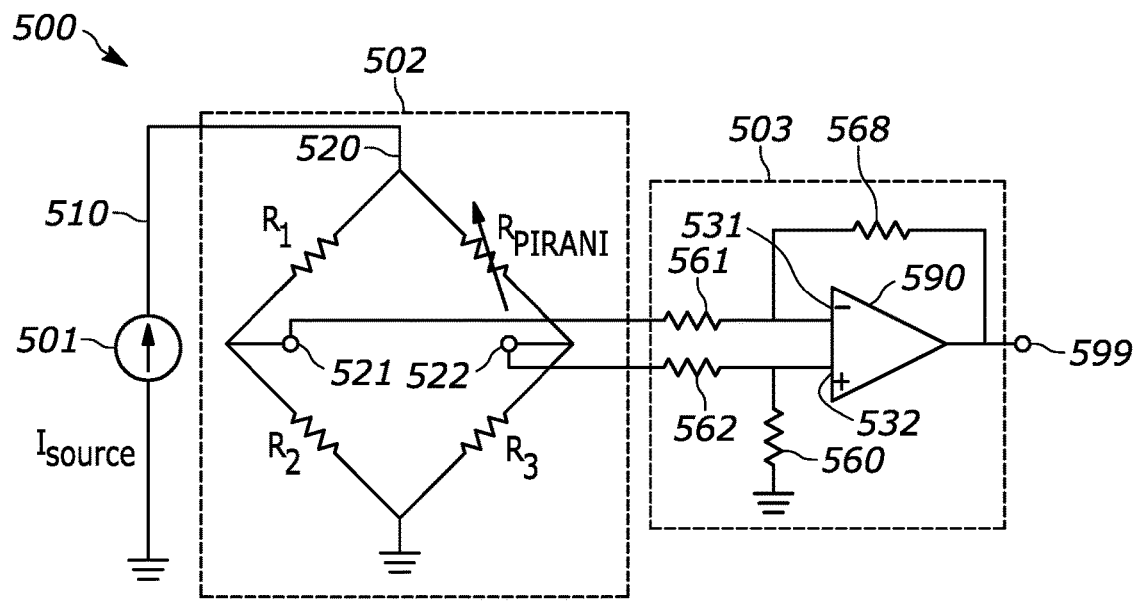
FIG. 5 depicts a pressure sensing circuit.

FIG. 5 depicts a pressure sensing circuit 500 in accordance with an illustrative embodiment. In some embodiments, the pressure sensing circuit 500 may be integrated with the electric circuit 103 as discussed in reference to FIG. 1. It is to be appreciated that the pressure sensing circuit 500 is merely one example of a pressure sensing circuit 500 that may be used in cooperation with a Pirani gauge such as the one discussed in reference to FIGS. 3 and 4. In alternative embodiments, as discussed above, the pressure sensing circuit 500 may include any type of circuit that is able to measure, determine, or detect the resistance of a Pirani gauge disposed within a cavity 242 of a transducer.

The pressure sensing circuit 500 includes a current source 501, a resistance detection circuit 502, and an amplifier circuit (e.g., or a differential circuit) 503. In some embodiments, the current source 501 may be a constant current source. In some embodiments, the current source 501 may include any current source that is configured to provide a current at a set or known rate.

The resistance detection circuity 502 is configured to receive a current from the current source 501 and provide an output that is indicative of the resistance of a particular resistive element (e.g., the resistance of a Pirani gauge). In some embodiments, the resistance detection circuit 502 includes a Wheatstone bridge. Alternatively or additionally, other components or circuits may be included in the resistance detection circuit 502. For example, in some embodiments, the resistance detection circuit 502 may include a voltage divider.

The current source 501 may have a first terminal connected to ground and an output terminal 510 that is connected to an input terminal 520 of the Wheatstone bridge. The Wheatstone bridge includes a first resistor $R_1$ connected between the input terminal 520 and a first output terminal 521 of the Wheatstone bridge 502. The Wheatstone bridge 502 includes a second resistor $R_2$ connected between the first output terminal 521 of the Wheatstone bridge 502 and ground (e.g., or a second known voltage). The Wheatstone bridge 502 has a Pirani gauge $R_{Pirani}$ (e.g., the Pirani gauge 300 as referenced in FIG. 3) connected between the input terminal 520 and a second output terminal 522 of the Wheatstone bridge 502. For example, in some embodiments, a first pad or electrical contact of the Pirani gauge may be connected to the input terminal 520 of the Wheatstone bridge 502 and a second pad or electrical contact of the Pirani gauge may be connected to the second output terminal 522 of the Wheatstone bridge 502. The Wheatstone bridge 502 also includes a third resistor $R_3$ connected between the second output terminal 522 of the Wheatstone bridge 502 and ground.

The first output terminal 521 of the Wheatstone bridge 502 is connected to a first input terminal 531 of the amplification circuit 503. The second output terminal 522 of the Wheatstone bridge 502 is connected to a second input terminal 532 of the amplification circuit 503. In some embodiments, the first input terminal 531 of the amplification circuit 503 is a negative terminal of an operation amplifier 590 and the second input terminal 532 of the amplification circuit 503 is a positive terminal of the operation amplifier 590. In some embodiments, the polarity of the terminals may be switched. In some embodiments, the pressure sensing circuit 500 may have a fourth resistor 560 that connects the second input terminal 532 to ground. In some embodiments, the pressure sensing circuit 500 may have a fifth resistor 562 that connects the second input terminal 532 to the second output terminal 522. In some embodiments, the pressure sensing circuit 500 may have a sixth resistor 561 that connects the first input terminal 531 to the second output terminal 521. In some embodiments, the pressure sensing circuit 500 may have a seventh resistor 568 that connects the first input terminal 531 to an output terminal 599 of the amplification circuit 503. In some embodiments, additional or fewer resistors may be used. In some embodiments, the amplification circuit 503 may include additional or fewer operational amplifiers, transistors, or various other components that allow for the determination of a resistance of the Pirani resistor $R_{Pirani}$. In some embodiments, one or more of the resistors may be formed on microelectromechanical (MEMS) or integrated circuit dyes. In some embodiments, the current source outputs a current of +/−20% of 600 microamperes.

The output terminal 599 may be connected to a processor or ASIC such that an output signal of the pressure sensing circuitry 500 can be read or detected in order to determine a resistance of the Pirani resistor $R_{Pirani}$ and thereby the pressure around the Pirani gauge. For example as explained above, the current source 501 will provide a current to the Wheatstone bridge 502 and thereby provide a current through the Pirani resistor $R_{Pirani}$ the current will affect the temperature of the Pirani resistor $R_{Pirani}$ and thereby will affect the effective resistance of the Pirani resistor $R_{Pirani}$. However, the amount that the current affects the effective resistance of the Pirani resistor $R_{Pirani}$ will depend on the pressure of the air around the Pirani gauge (e.g., the pressure in the cavity) because the amount of heat that the Pirani resistor can transfer to the heat sink (e.g., or lose in the cavity) is dependent on the pressure of the cavity. Thus, by measuring the amount that a resistance of the Pirani resistor $R_{Pirani}$ changes (e.g., via measuring or monitoring the imbalance in the voltages of the two output terminals 521 and 522 of the Wheatstone bridge 502) will allow the processor or ASIC (e.g., electric circuit 103) to determine or estimate the pressure within the cavity. In some embodiments, the processor may first determine a resistance of the Pirani resistor $R_{Pirani}$ and then calculate, look-up, or otherwise estimate the pressure based of the known values of all of the other components (e.g., $R_1$, $R_2$, $R_3$, etc.) It is to be appreciated that FIG. 5 is meant by way of example only and that other methods or devices may be used to measure the resistance of the Pirani resistor $R_{Pirani}$ in order to determine or estimate a pressure within the cavity 242.

Figure 6:
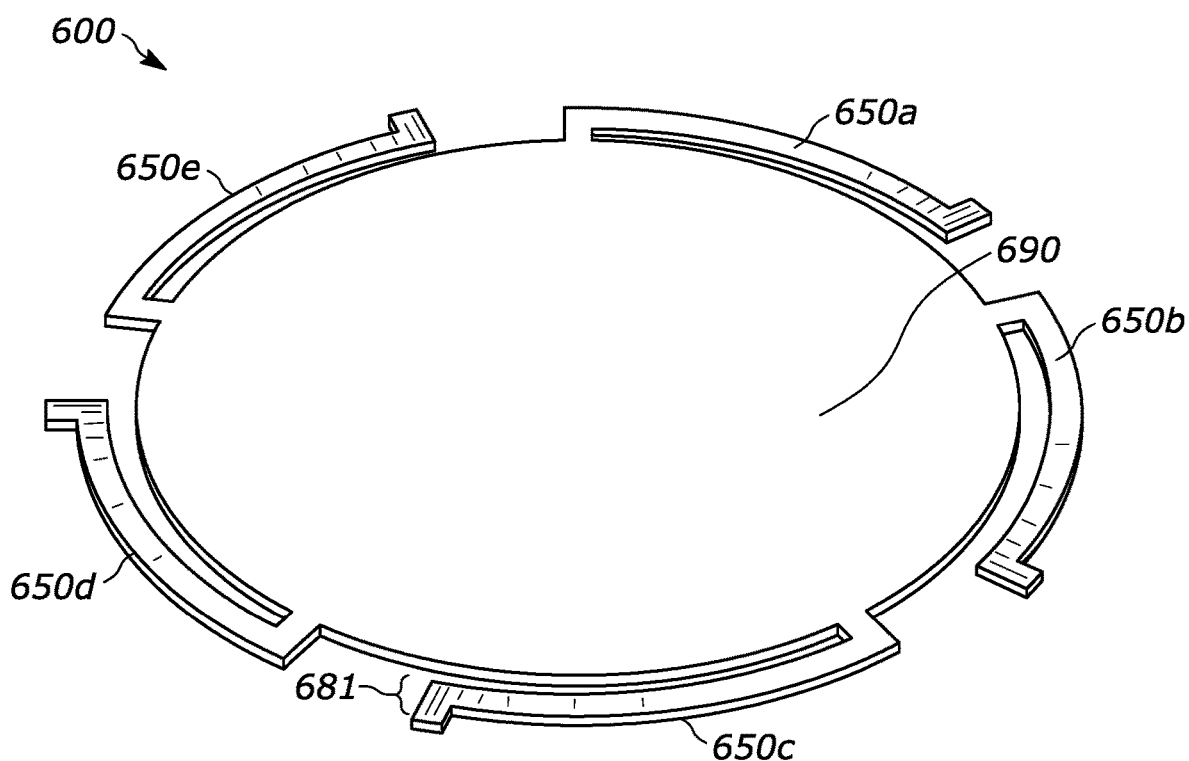
FIG. 6 depicts an integrated resonator.
Figure 7:
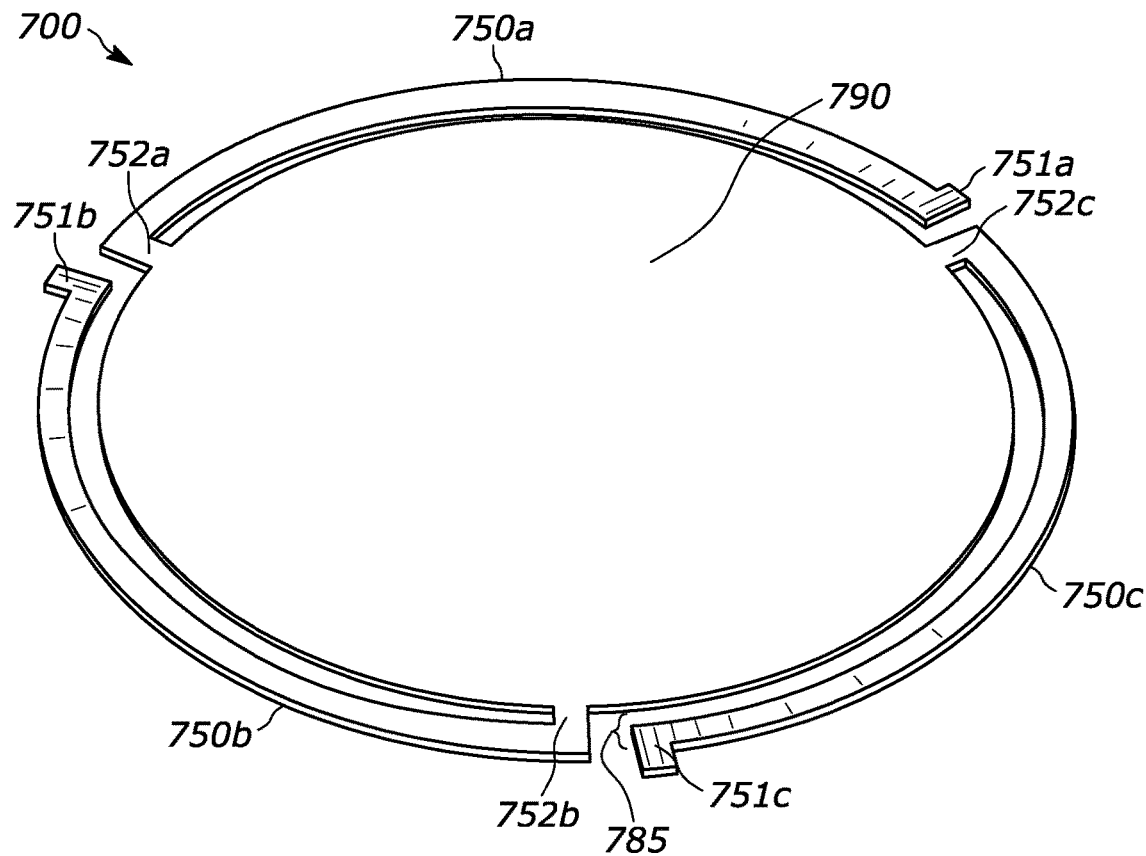
FIG. 7 depicts an integrated resonator.

Referring now generally to FIGS. 6 and 7, FIG. 6 depicts an integrated resonator 600 in accordance with an illustrative embodiment. FIG. 7 depicts an integrated resonator 700 in accordance with an illustrative embodiment. In some embodiments, the integrated resonator 600 or 700 may be the pressure sensor referenced above in FIGS. 1 and 2 and be disposed on the backplate 240 or a portion of the backplate 240. The integrated resonator 600 includes a plurality of springs 650a-e and a surface 690 (e.g., a resonating member), wherein the plurality of springs 650a-e are connected to the backplate at a first end and connected to an outer edge of the surface 690 at a second end, wherein the plurality of springs suspend the surface over or below a counter electrode by a distance 681. The springs 650a-e are configured to lift or suspend the surface over a substrate or the counter electrode and provide elasticity to the surface so that the surface 690 can wiggle, bounce, or otherwise have a resonant frequency. In some embodiments, the springs 650a-e (or a single spring) may be configured to suspend the surface within an opening of the substrate or the backplate such that the surface 690 (e.g., resonating member) may be suspended within the same plane in which the backplate extends. The exact resonant frequency of a particular integrated resonator may be dependent on the elastic strength of the materials for the spring's 650a-e, the surface area of the surface 690, the number of springs 650a-e, and the pressure of the air surrounding the surface 690. The exact compositional makeup of each of the components of an integrated resonator may be dependent on the particular applications (e.g., the set or manufactured pressure of a particular cavity) in which the integrated resonator will be deployed. In some embodiments, the integrated resonator 600 may be made from silicon nitride.

Referring generally now to FIG. 7, the integrated resonator 700 is similar to the integrated resonator 600 as described in reference to FIG. 6. That is, the integrated resonator 700 includes multiple springs 750a-c that are designed to suspend a surface 790 over or below a counter electrode (e.g., or other substrate that electrically conducting) by a distance 785. For example, the integrated resonator 700 includes a first spring 750a connected to the backplate at a first end 751a, and connected to a first portion of the outer edge of the surface 790 at a second end 752a. The integrated resonator 700 also includes a second spring 750b connected to the backplate at a first end 751b, and connected to a second portion of the outer edge of the surface 790 at a second end 752b. The integrated resonator 700 also includes a third spring 750c connected to the backplate at a first end 751c, and connected to a third portion of the outer edge of the surface 790 at a second end. 752c. One or more of the springs 750a-c may be electrically connected to the electric circuit 103 (e.g., a pressure sensing circuit) via the ends connected to backplate such that the resonator can receive a drive signal on at least one of the first ends 751a-c. In some embodiments, a corresponding backplate may have an opening defined therein such that the first ends 751a-c may coupled to or be coupled to respective portions of the opening and the resonating member (the surface 790) may be suspended in the same plane in which the backplate extends. In some embodiments, the surface 690 or 790 may be suspended in a plane above or below the plane in which the backplate extends. In some embodiments, additional or fewer springs 750a-c may be used or implemented in order to design the integrated resonator 700 or 600 to have particular resonant frequencies under intended or estimated pressures (e.g., intended or estimated pressures within the cavity 242). In some embodiments, the resonator 700 may be made out of silicon nitride, polysilicon, or a multi-stack containing one or more layers of both silicon nitride and polysilicon. In some embodiments, the back plate may be formed from silicon nitride, polysilicon, or a multi-stack containing one or more layers of both silicon nitride and polysilicon. In some embodiments, the resonator is formed within the backplate.

The integrated resonator 700 may have a different resonant frequency than the integrated resonator 600 of FIG. 6. It is to be appreciated that FIGS. 6 and 7 are shown as examples of particular embodiments of example integrated resonators. The design, shape, or composition of the materials (e.g., springs or surface) may be changed depending upon the exact applications and the estimate pressure that may be within the cavity. For example, the resonators 600 or 700 may be designed to resonate within the range of 20-150 kHz. In some embodiments, each of the springs 650 and 750 are connected to the electric circuit 103 such that the electric circuit can provide a signal to the integrated resonator 600 or 700 and/or counter electrode. In some embodiments, the integrated resonator 700 may have one or more supports that extend from one or more portions of the surface 690 or 790 toward to backplate in order to provide support to the surface.

Figure 8A:
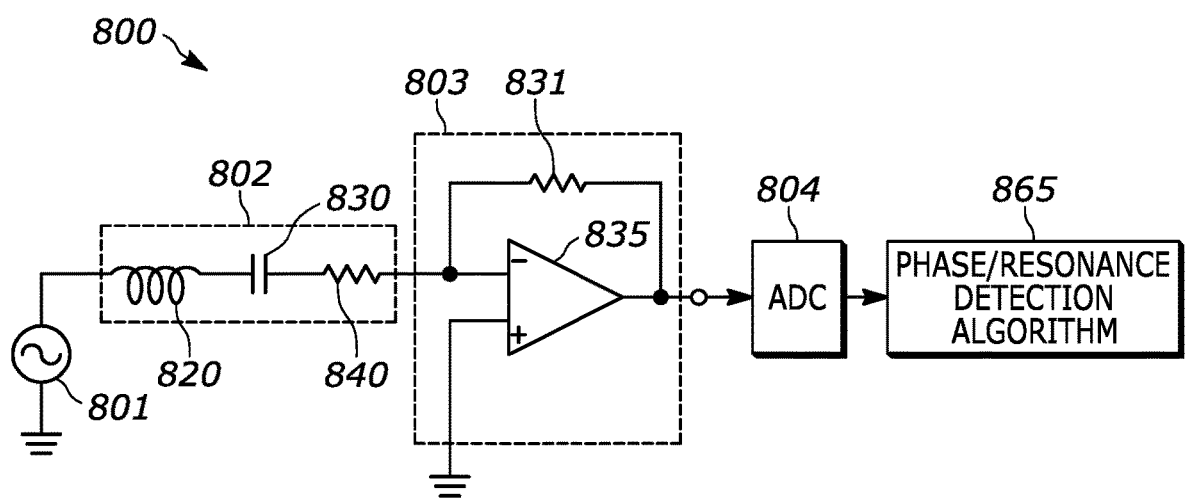
FIG. 8a depicts an example of a pressure sensing circuit.

FIG. 8a depicts an example of a pressure sensing circuit 800 in accordance with an illustrative embodiment. In some embodiments, the pressure sensing circuit 800 may be integrated with the electric circuit 103 as discussed in reference to FIG. 1. The pressure sensing circuit 800 includes a swept frequency source 801, a resonator circuit 802, and a trans-impedance amplifying circuit 803. In some embodiments, the pressure sensing circuit 800 may also include an analog to digital converter (ADC) 804 connected to the output of the trans-impedance amplifying circuit 803. In some embodiments, an output of the analog to digital converter 804 may be received or accessed or otherwise by a processor or other processing device that is configured to determine a phase or resonant frequency of the resonating circuit 802 (e.g., and thereby the resonating frequency of the of the integrated resonator that may be used as at least a portion of the resonating circuit 802), for example, at operation 865. It is to be appreciated that the pressure sensing circuit 800 is merely one example of a pressure sensing circuit 800 that may be used in cooperation with a resonator such as the resonators discussed in reference to FIGS. 6 and 7. In alternative embodiments, as discussed above, the pressure sensing circuit 800 may include any type of circuit that is able to measure, determine, or detect the resonant frequency of a resonating device or element.

An output of the swept frequency source 801 is connected to the resonator circuit 802. In some embodiments, the swept frequency source 801 may include any device that is configured to generate a swept frequency output signal. In some embodiments, the swept frequency source 801 is configured to generate a signal having a first frequency and sweep the signal in a continuous manner to a second frequency over a time period. In some embodiments, the continuous manner is linear.

The resonator circuit 802 is an electrical representation of an integrated resonator that includes for an example an inductive element 820, a capacitive element 830, and a resistive element 840 wired in series. In some embodiments, the values of the representation of the electrical elements 820, 830, or 840 or wiring configurations thereof may be dependent upon the exact mechanical or electromechanical configuration of the particular integrated resonator being implemented or applied.

In some embodiments, the resonator circuit 800 includes the back plate (e.g., 240). That is, in some embodiments, the signal from the swept frequency source 801 may be applied to a first electrode on the back plate in order to cause the back plate to resonate at a particular frequency that may then be monitored and determined. That is, in some embodiments, the back plate 240, or portion thereof, contained within the cavity has its own resonant frequency. A drive signal may be applied to the back plate via an electric pad or terminal on the back plate and monitored in order to determine the resonance of the back plate and thereby the pressure within the cavity. In some embodiments, the back plate is independent of the acoustics surrounding the transducer, unlike the resonance of a first or second diaphragm or of the transducer and therefore can be used to accurately measure the pressure within the cavity.

An output of the resonator circuit 802 (e.g., the integrated resonator) is connected to an input of the trans-impedance amplifier 803. In some embodiments, the input of the trans-impedance amplifier 803 is a negative terminal of an operation amplifier 835. In some embodiments, the positive terminal of the operational amplifier 835 may be connected to ground. A resistor 831 may be connected between the negative terminal of an operation amplifier 835 and an output terminal of the operation amplifier 835. Additionally or alternatively, the trans-impedance amplifier 803 may include additional or fewer resistors, transistors, or operational amplifiers.

The trans-impedance amplifier 803 is configured to receive a signal from the resonator circuity 802 and amplify the signal. The amplified signal may then be processed or otherwise analyzed in order to determine the resonant frequency of the resonator circuit 802 (e.g., and thereby the resonant frequency of the integrated resonator 600 or 700). The processor may then use the determined resonant frequency of the integrated resonator 600 or 700 to determine a pressure around the integrated resonator 600 or 700. In some embodiments, the processor (e.g., or ASIC) may use a known or stored frequency response graph or function of the integrated resonators (e.g., 600 or 700) frequency response versus surrounding pressure to determine the pressure within the cavity. For example, the electric circuity 103 may include (e.g., stored in memory) a function, look-up table, or graph of resonant frequencies under different pressures for a particular integrated resonator (e.g., 600 or 700) (or particular backplate) in order to determine the pressure around the integrated resonator (e.g., 600 or 700) (or the backplate) based on the determined resonant frequency determined from the amplified signal. In some embodiments, the processor may determine or estimate the pressure based on the amplified signal by determining the amplified signals phase or quality factor. For example, the processor may use a known or stored phase response or quality factor information under different pressures to determine the pressure around the integrated resonator.

In some embodiments, the pressure sensing circuit 800 may include an analog digital converter that is configured to convert the amplified signal received from trans-impedance amplifier 803 into a digital format before the processor or other processing device determines the resonant frequency of the resonating circuit 802. In some embodiments, the determination of the resonant frequency of the resonating circuit 802 may be done in either the analog or digital domain.

Figure 8B:
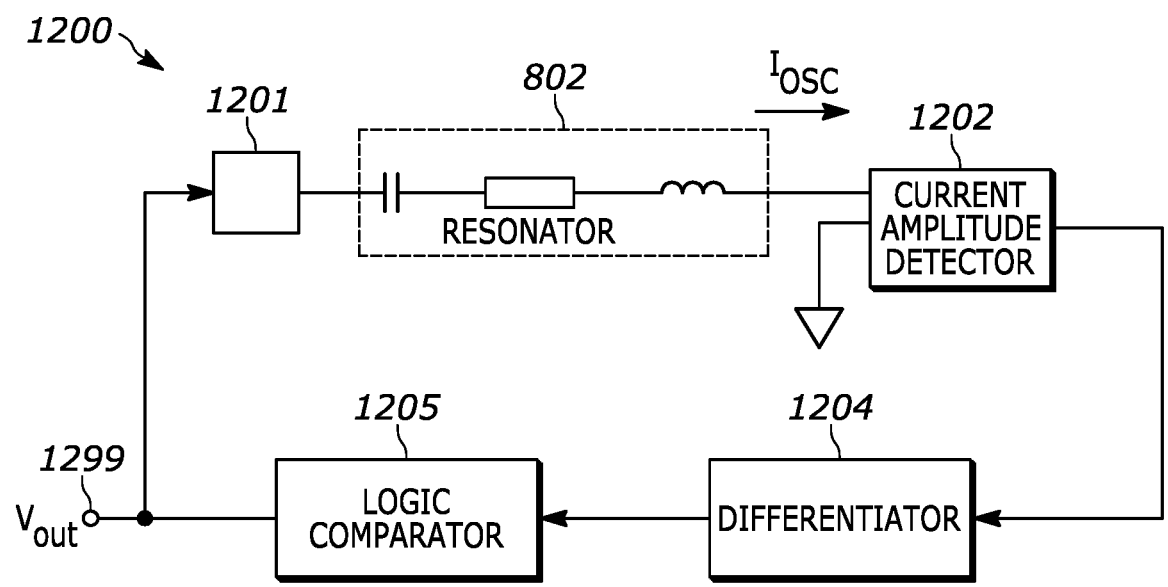
FIG. 8b depicts a second example of a pressure sensing circuit.

FIG. 8b depicts another example of a pressure sensing circuit 1200 in accordance with an illustrative embodiment. In some embodiments, the pressure sensing circuit 1200 may be integrated with the electric circuit 103 as discussed in reference to FIG. 1. The pressure sensing circuit 1200 includes an oscillating circuit 1201, the resonator circuit 802, a current amplitude detection circuit 1202, a differentiator circuit 1204, and a comparator circuit 1205. In some embodiments, the resonator circuit 802 is similar or the same as the resonator circuit 802 described in reference to FIG. 8a.

The resonator circuit 802 is coupled between the oscillating circuit 1201 and the current amplitude detection circuit 1202. In some embodiments, the oscillating circuit 1201 is a voltage controlled oscillator. In some embodiments, the oscillating circuit 1201 may include any circuit or element that is configured to generate oscillating electrical signals selectively at various frequencies. An output of the current amplitude detection circuit 1202 is coupled to an input of the differentiating circuit 1204 and output of the differentiator circuit 1204 is coupled to an input of the comparator circuit 1205. An output of the comparator circuit 1205 is connected to an output terminal 1299 of the pressure sensing circuit 1200 and an input of the oscillating circuit 1201. In some embodiments, the differentiator circuit 1204 may be or include any circuit that is configured to produce an output signal that is a first derivative of the input signal. In some embodiments, the differentiator circuit 1204 may be implemented via hardware, software via a processor executing particular instructions, or a combination thereof. In some embodiments, the comparator circuit 1205 may be any circuit that is configured to compare two voltages or currents and output a digital signal indicating which of the two voltages or currents are larger. In some embodiments, the comparator circuit 1205 may be implemented via hardware, software via a processor executing particular instructions, or a combination thereof. In some embodiments, the current amplitude detector circuit 1202 may be any circuit that is configured to detect the electrical current flowing through resonator 802 when driven by oscillator 1201. In some embodiments, when starting the oscillator at a certain (e.g., pre-determined) initial frequency, determined by the initial value of the output voltage at terminal 1299, current amplitude detection circuit 1202 detects an initial current amplitude. The differentiator 1204 determines the time derivative of the detected current amplitude and outputs a value to logic comparator circuit 1205. Initially, the time derivative of the current amplitude may be positive, since no prior values exist. Receiving a positive value on its input, may cause logic comparator circuit 1205 to increase the voltage on its output by a predetermined increment. The increased voltage on output terminal 1299 and input of oscillator 1201, causes oscillator 1201 to increase its frequency by a predetermined amount. At this point, the circuit loop completes another cycle to determine if the current amplitude in the resonator is higher or lower than the previous value. If the current amplitude is higher, the circuit responds by further increasing the voltage on output terminal 1299, and consequently the oscillator frequency. If the current amplitude is lower, the circuit responds by reducing the voltage on output terminal 1299, and consequently the oscillator frequency. The operation of circuit 1200 is that of a hill-climbing algorithm to find and maintain the oscillator frequency at which the current amplitude in resonator 802 is at maximum. This oscillator frequency coincides with the resonance frequency of the resonator 802, and the voltage on the output terminal 1299 may be used as an indirect measure of the resonator frequency.

The pressure sensing circuit 1200 determines the pressure within the cavity (e.g., around a resonator of the resonating circuit 802 disposed within the cavity) by determining the resonance frequency of resonator 802 and providing an electrical output representative of the resonance frequency. The electrical output may be compared to stored or known values previously determined that relate electrical output level at output terminal 1299 to pressure surrounding the integrated resonator.

Figure 8C:
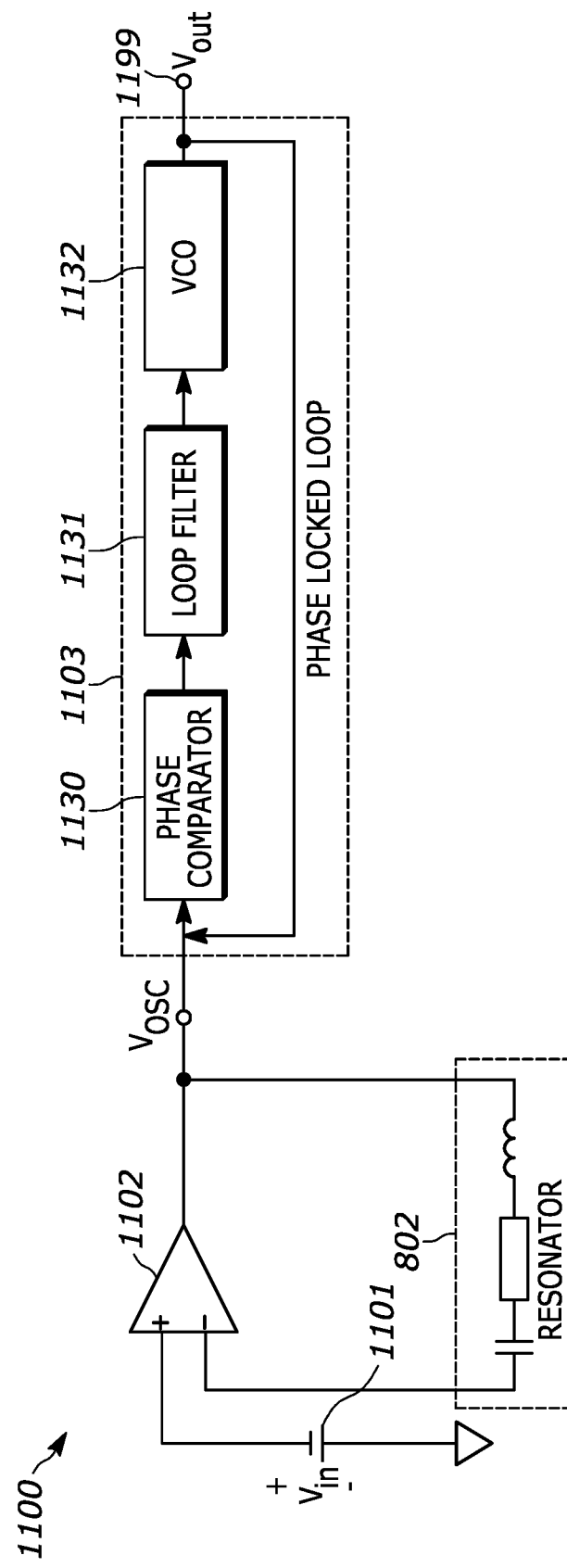
FIG. 8c depicts a third example of a pressure sensing circuit.

FIG. 8c depicts another example of a pressure sensing circuit 1100 in accordance with an illustrative embodiment. In some embodiments, the pressure sensing circuit 1100 may be integrated with the electric circuit 103 as discussed in reference to FIG. 1. The pressure sensing circuit 1100 includes a voltage source 1101, an amplifying circuit 1102 a resonator circuit 802, and a phase locked loop (PLL) circuit 1103. In some embodiments, the resonator circuit 802 is similar or the same as the resonator circuit 802 described in reference to FIG. 8a.

In some embodiments, the voltage source 1101 is coupled to an input of the amplifying circuit 1102. In some embodiments, the amplifying circuit 1102 includes an operational amplifier. In some embodiments, an output of the voltage source 1101 is coupled to a first (e.g., positive or negative) input terminal of the operational amplifier. The resonating circuit 802 is coupled between a second input terminal of the operation amplifier and an output of the operational amplifier. The output of the operational amplifier is also connected to an input of the PLL circuit 1103.

In some embodiments, the PLL circuit 1103 includes a phase comparator circuit 1130, a filter circuit 1131 (e.g., a loop filter) connected to an output of the comparator circuit 1130, and an oscillating circuit 1132 (e.g., a voltage-controlled oscillator). The phase comparator circuit 1130 has an input that is also the input of the PLL circuit 1103 and an output that is coupled to an input of the filter circuit 1131. The oscillating circuit 1132 may have an output that is coupled to an output terminal 1199 of the pressure sensing circuit 1110 and an input that is connected to an output of the filter circuit 1131. In some embodiments, the oscillating circuit 1132 is similar or the same as the oscillating circuit 1201 described above in reference to FIG. 8b. It is to be appreciated that the PLL circuit 1103 is only one example of a phase locked loop circuit and that in other embodiments, other forms of PLL circuits may be deployed or used. In some embodiments, the PLL circuit 1103 may be an analog or a digital circuit disposed on the electric circuit 103 (e.g., ASIC). In some embodiments, the PLL circuit 1103 may implemented using software ran on a processor (e.g., a processor of the ASIC).

The pressure sensing circuit 1100 determines the pressure within the cavity (e.g., around a resonator of the resonating circuit 802 disposed within the cavity) by matching the frequency of voltage controlled oscillator 1132 to that of the free running oscillator formed by operational amplifier 1102 and resonator 802. As for pressure sensing circuit 1200, the control voltage for voltage controlled oscillator 1132 may be an indirect measure of the resonance frequency of resonator 802, and provide an electrical output representative of the resonance frequency on output terminal 1199. The electrical output may be compared to stored or known values previously determined that relate electrical output level at output terminal 1199 to pressure surrounding the integrated resonator.

Figure 8D:
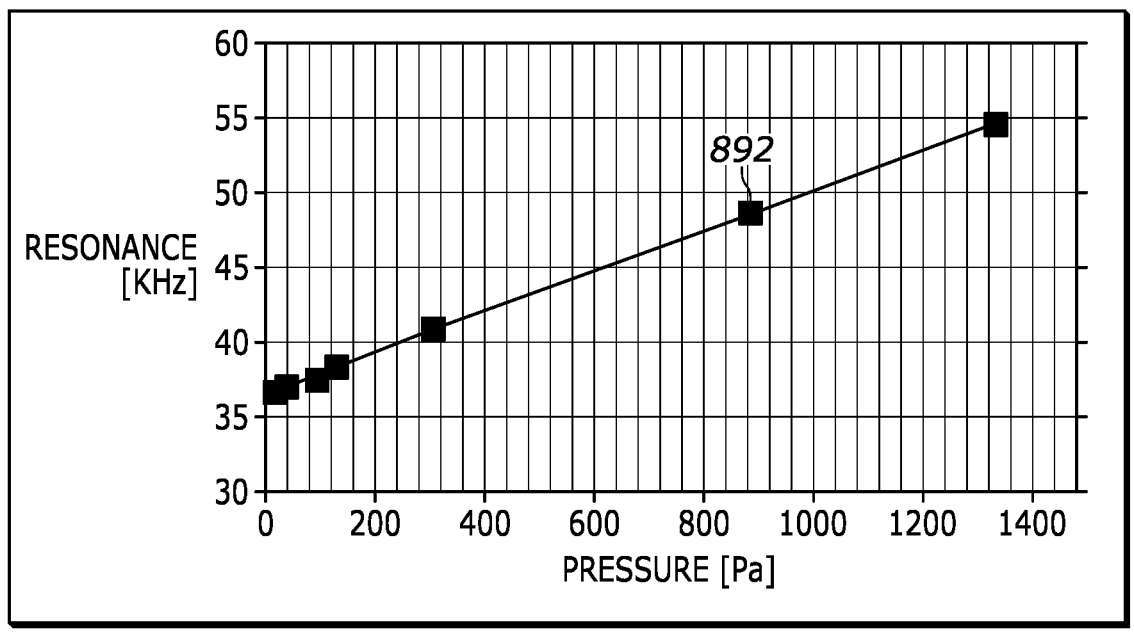
FIG. 8d depicts a graph of a resonant response characteristic of an integrated resonator.

FIG. 8d depicts a graph 890 of a resonant response characteristic of an integrated resonator with an illustrative embodiment. The graph 890 includes a y-axis that indicates a resonant frequency for a particular integrated resonator and an x-axis that indicates a pressure surrounding the integrated resonator (e.g., pressure within a cavity). The graph 890 includes a signal profile 892 of a particular resonant frequency response characteristic for a particular integrated resonator. In this way, once pressure sensing circuitry is used to determine the resonant frequency of the integrated resonator within a cavity, then the pressure of the cavity may then be determined or interpolated using the graph 890 or function of the signal profile 892.

Figure 8E:
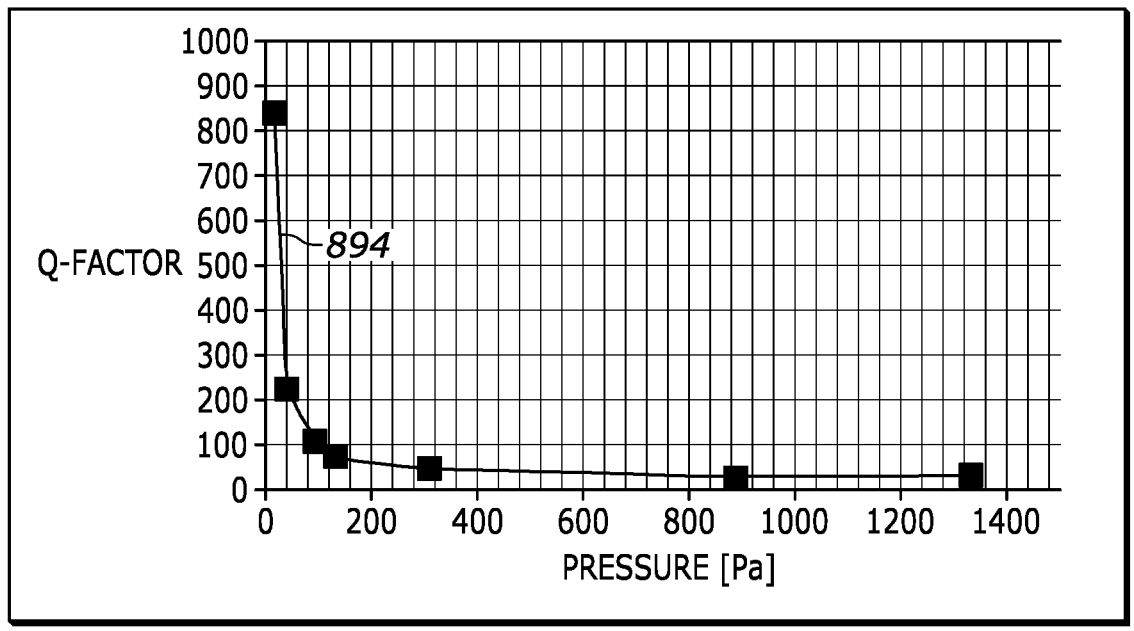
FIG. 8e depicts a graph of a quality factor characteristic of an integrated resonator in accordance with an illustrative embodiment.

FIG. 8e depicts a graph 893 of a quality factor characteristic 893 of an integrated resonator with an illustrative embodiment. The graph 893 includes a y-axis that indicates a quality factor for a particular integrated resonator and an x-axis that indicates a pressure surrounding the integrated resonator (e.g., pressure within a cavity). The graph 893 includes a signal profile 894 of a particular resonant frequency response characteristic for a particular integrated resonator. In this way, once a pressure sensing circuitry is used to determine the quality factor of the integrated resonator within a cavity, then the pressure of the cavity may then be determined or interpolated using the graph 893 or function of the signal profile 894.

FIG. 8f depicts multiple examples of potential integrated resonator designs 897 and the respective resonant frequency response characteristics (without air loading) vs tensile film stress 898 for the multiple examples of potential integrated resonator designs 897.

FIG. 9a depicts a top cutaway view of a transducer 900 in accordance with an illustrative embodiment. The top cutaway view of the transducer 900 depicts a backplate 901 of the transducer. That is, the top cutaway view of the transducer 900 depicts a top view of a transducer without a second or top diaphragm. FIG. 9b depicts an enlarged portion 950 of the transducer 900 of FIG. 9a in accordance with an illustrative embodiment. More particularly, enlarged portion 950 of the transducer 900 depicts an integrated resonator disposed on the backplate 901. In some embodiments, the integrated resonator may be similar to one or more of the integrated resonators described herein.

The backplate 901 includes one or more apertures 952. In some embodiments, the one or more apertures may be similar to the one or more apertures 252 as referenced in the discussion of FIG. 2. In some embodiments, the backplate 901 is similar to the backplate 240 as referenced in the discussion of FIG. 2. The transducer 900 includes an integrated resonator disposed on the backplate 901 as depicted in FIG. 9b. In some embodiments, the integrated resonator may be disposed on the backplate at different or alternative locations on the backplate 901. The integrated resonator includes one or more springs 920 and a surface 909. In some embodiments, the surface 909 may include an aperture 922 that allows a top diaphragm to have a post or a support to extend therethrough in order to prevent the top diaphragm from collapse onto or otherwise contact the surface 909. In some embodiments, the aperture 922 is at the center of the surface 909. In some embodiments, the surface 909 may also have multiple release holes 921 that are configured to allow for proper removal of sacrificial layers surrounding the integrated resonator during fabrication. The integrated resonator may be electrically connected between a first terminal 902 and a second terminal 904 of the transducer 900. The first and second terminals 902 and 904 are designed such that the integrated resonator 900 may be connected to pressure sensing circuitry. In some embodiments, the first terminal 902 may be electrically connected to one or more electrodes on the surface 909 (or the surface 909 itself) and the second terminal 904 may be connected to one or more counter electrodes formed above or below the surface 909. In some embodiments, the surface 909 may be made from the same material or layers as the back plate such that the surface 909 extends along the same plane as the back plate. In some embodiments, one or more counter electrodes may be formed above and/or below the surface 909 using an electrode layer from the top and/or bottom diaphragm of the microphone.

Figure 10A:
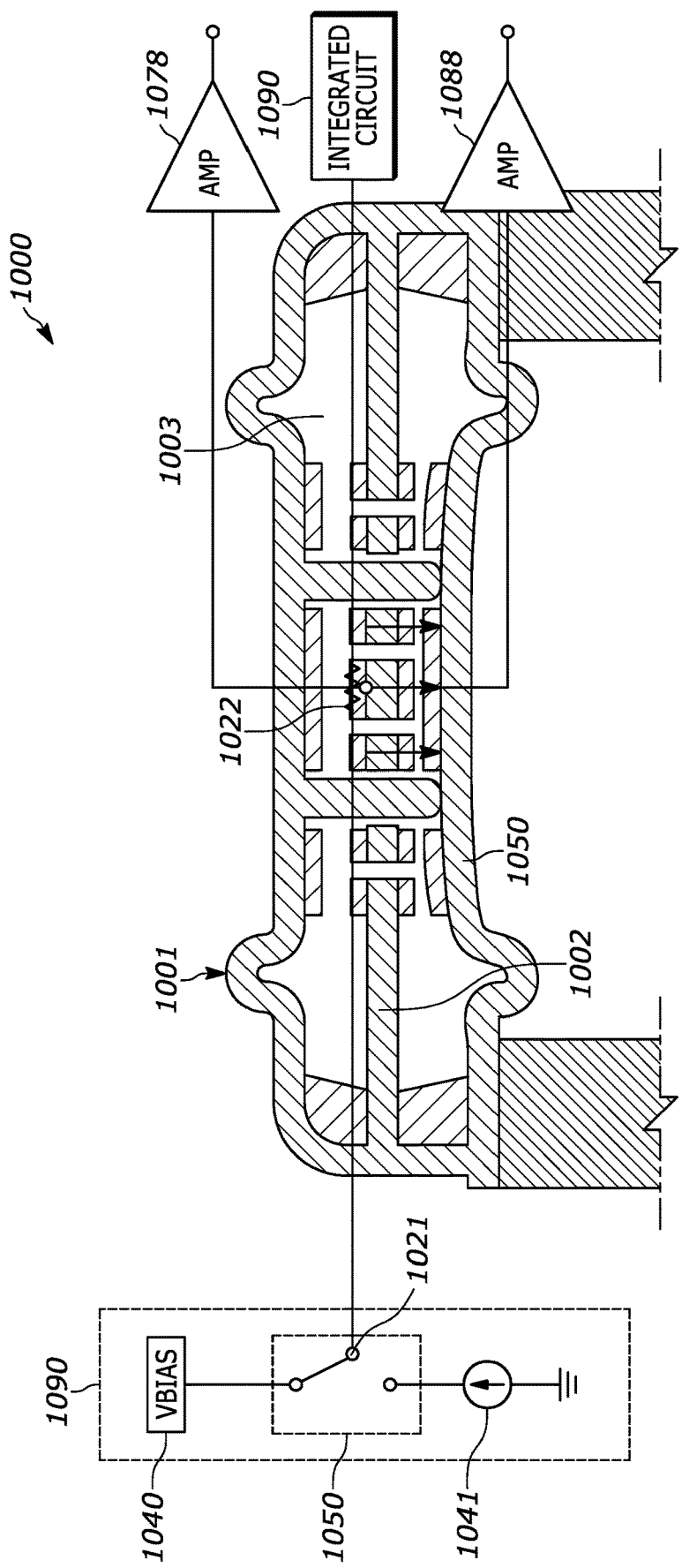
FIG. 10a, another example of a pressure sensing circuit of a transducer.

Referring now generally to FIGS. 10a, another example of a pressure sensing circuit 1000 of a transducer in accordance with an illustrative embodiment. The pressure sensing circuit 1000 is configured to use a backplate 1002 of a transducer 1001 in order to sense or determine the pressure within the cavity 1003. In some embodiments, the backplate 1002 can be used as a Pirani gauge. That is, in some embodiments, a bottom (e.g., a first) diaphragm 1050 may be serve as a heat sink that allows for an electrode of the backplate to serve as Pirani gauge.

In some embodiments, the pressure sensing circuit 1000 includes a bias circuit 1090 that is configured to selectively apply (e.g., via a switch 1050) a voltage bias 1040 or a current source 1041 to the electrode on the backplate 1002 through a first connection 1021. In some embodiments, the switch includes one or more transistors or other static or dynamic electrical components that are configured to selectively switch between the voltage bias 1040 and the current source 1041. In some embodiments, the voltage bias 1040 is applied to the backplate 1002 when the transducer 1001 is in an operational mode of sensing acoustic signals. That is, in an operational mode, a DC bias voltage is applied to backplate 1002 and a first capacitance and a second capacitance may be monitored via a first and second amplifier 1078 and 1088, respectively in order to generate an electrical signal that is indicative of acoustic energy sensed via the transducer 1001.

In some embodiments, the current source 1041 is selectively applied to the backplate 1002 during a testing mode. The testing mode may be configured to determine or measure the pressure within the cavity 1003. The current source 1041 may be similar to current source as referenced in FIG. 5 and be configured to apply a current (e.g., a constant current) to the backplate. The backplate 1002 may begin to heat as a result of passing the current through the first electrode 1021 of the backplate 1002 to a second electrode or contact 1022. Similar to as discussed in reference to FIG. 5, the heat causes the effective resistance of the backplate 1002 to change via the conduction of heat between the backplate 1002 (e.g., acting as a micro-beam) to the first diaphragm 1050 (e.g., acting as a heat sink). Resistance detection circuitry 1090 may then be used to monitor the effective resistance (e.g., the actual resistance at a set time) of the backplate 1002 in order to indicate the pressure in the cavity 1003. In some embodiments, the resistance detection circuitry 1090 may include a Wheatstone bridge similar to the one referenced in FIG. 5, a voltage divider, or other circuitry configured to indicate a measured resistance of a resistor.

Figure 10B:
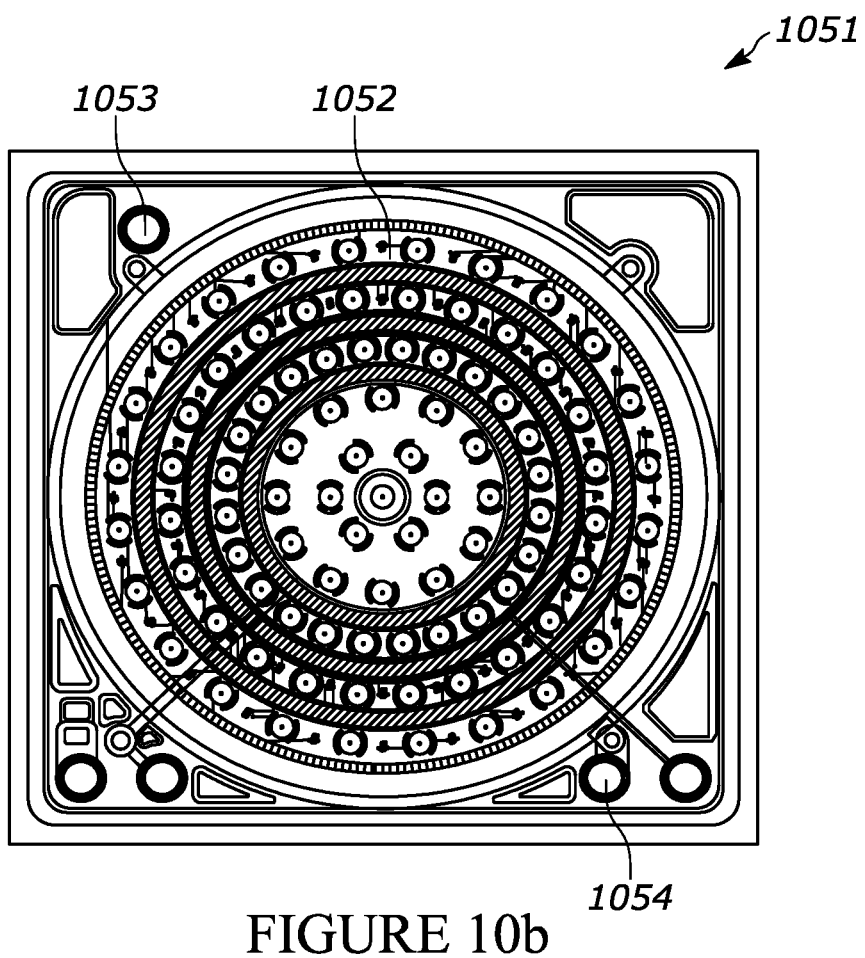
FIG. 10b depicts a top cutaway view of a transducer.

FIG. 10b depicts a top cutaway view of a transducer 1051 in accordance with an illustrative embodiment. The top cutaway view of the transducer 1051 depicts a backplate 1052 of the transducer 1051. That is, the top cutaway view of the transducer 1051 depicts a top view of a transducer without a second or top diaphragm. The backplate 1052 may be electrically connected between a first terminal 1053 and a second terminal 1054 of the transducer 1051. The first and second terminals 1053 and 1054 are designed such that the backplate may be connected to pressure sensing circuitry. In some embodiments, the backplate 1052 is electrically connected to pressure sensing circuitry similar to as described in reference to FIG. 10a.

In some embodiments, the Pirani gauge and/or the resonator may be formed in, on, or apart of either the back plate and or one of the diaphragms. In some embodiments, the Pirani gauge and/or resonator may be formed with the back plate and/or top or bottom diaphragm layer either as a single element or as a combination of multiple different elements.

Embodiments described herein relate generally to systems and methods for detecting and/or monitoring pressure within a hermetically sealed cavity of an acoustic transducer. In particular, some embodiments described herein relate to detecting a pressure within a hermetically sealed cavity defined by at least a first diaphragm and having at least part of a backplate disposed therein in order to monitor the sensitivity and accurateness or noise of a microphone assembly. In an implementation, the acoustic transducer includes a microelectromechanical (MEMS) die that includes an at least partially evacuated hermetically sealed cavity defined in part by a first diaphragm, a backplate disposed within the cavity, where the first diaphragm is movable relative to the back plate in response to acoustic pressure, and a pressure sensor coupled on the backplate and configured to sense a pressure within the cavity.

In some embodiments, the at least partially evacuated hermetically sealed cavity is further defined by a second diaphragm spaced apart from the first diaphragm. In some embodiments, the backplate defines at least one aperture therethrough. In some embodiments, the acoustic transducer further includes a first terminal electrically coupled to a first portion of the backplate, and a second terminal electrically coupled to a second portion of the backplate. In some embodiments, the pressure sensor comprises a Pirani gauge formed on the backplate. In some embodiments, the Pirani gauge comprising a micro-beam resistor, a first pad formed on the backplate, and a second pad formed on backplate, wherein the micro-beam resistor is connected to the first pad and to the second pad and is suspended over or below a heat sink. In some embodiments, the first pad is electrically coupled to the first terminal and the second pad is electrically coupled to second terminal. In some embodiments, wherein the micro-beam resistor is configured to carry a bias current from the first terminal to the second terminal.

In some embodiments, the pressure sensor comprises an integrated resonator coupled to the backplate. In some embodiments, the integrated resonator comprises a spring and a resonating member, wherein the spring is connected to the backplate and connected to an outer edge of the resonating member, wherein the spring suspends the surface with respect to backplate. In some embodiments, integrated resonator further includes a first spring connected to the backplate at a first end, and connected to a first portion of the outer edge of the surface, a second spring connected to the backplate at a first end, and connected to a second portion of the outer edge of the surface, and a third spring connected to the backplate at a first end, and connected to a third portion of the outer edge of the surface.

In another implementation, a microphone assembly includes a housing, an acoustic transducer disposed within the housing, and an integrated circuit disposed within the housing. The acoustic transducer an at least partially evacuated hermetically sealed cavity defined in part by a first diaphragm, a backplate disposed within the cavity, where the first diaphragm is movable relative to the back plate in response to acoustic pressure, and a pressure sensor coupled on the backplate and configured to sense a pressure within the cavity. The integrated circuit includes a pressure sensing circuit connected to the pressure sensor and configured to process the electrical signal from the pressure sensor to generate output data indicative of the pressure.

In some embodiments, the at least partially evacuated hermetically sealed cavity is further defined by a second diaphragm spaced apart from the first diaphragm. In some embodiments, the backplate defines at least one aperture therethrough. In some embodiments, the pressure sensor comprises a Pirani gauge coupled to the backplate, the Pirani gauge comprising a micro-beam resistor, a first pad formed on the backplate, and a second pad formed on the backplate, wherein the micro-beam resistor is connected to the first pad and to the second pad and is suspended with respect to the backplate. In some embodiments, the pressure sensing circuit includes a Wheatstone bridge and differential amplifier, the micro-beam resistor connected in a first leg of the Wheatstone bridge. In some embodiments, the pressure sensor comprises an integrated resonator coupled to the backplate, the integrated resonator comprising a spring and a resonating member, wherein the spring is connected the backplate and connected to an outer edge of the resonating member, wherein the spring suspends the resonating member with respect to the backplate. In some embodiments, the pressure sensing circuit comprising a swept frequency generator and a trans-impedance amplifier, an output of the swept frequency generator connected to an input of the integrated resonator, and the trans-impedance amplifier connected to an output of the integrated resonator. In some embodiments, the pressure sensing circuit further includes an analog to digital converter connected to an output of the trans-impedance amplifier, and the integrated circuit further includes a processor configured to receive a signal from the analog to digital converter and detect a phase of the signal and a frequency indicative of the resonant frequency of the integrated resonator. In some embodiments, the integrated resonator has a resonant frequency dependent on the pressure in the cavity. In some embodiments, the integrated resonator has a range of resonant frequencies between 50 kiloHertz (kHz) and 100 kHz.

In another implementation, a microphone assembly includes a housing, an acoustic transducer disposed within the housing, and an integrated circuit disposed within the housing. The acoustic transducer includes an at least partially evacuated hermetically sealed cavity defined in part by a first diaphragm, a backplate disposed within the cavity, where the first diaphragm is movable relative to the back plate in response to acoustic pressure. The backplate being configured to sense the pressure within the cavity. The integrated circuit is connected to the backplate and includes bias circuitry that is configured to selectively apply a bias voltage to the backplate or apply a sensing circuity to the backplate.

The herein described subject matter sometimes illustrates different components contained within, or connected with, different other components. It is to be understood that such depicted architectures are illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.).

Although the figures and description may illustrate a specific order of method steps, the order of such steps may differ from what is depicted and described, unless specified differently above. Also, two or more steps may be performed concurrently or with partial concurrence, unless specified differently above. Such variation may depend, for example, on the software and hardware systems chosen and on designer choice. All such variations are within the scope of the disclosure. Likewise, software implementations of the described methods could be accomplished with standard programming techniques with rule-based logic and other logic to accomplish the various connection steps, processing steps, comparison steps, and decision steps.

It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations).

Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

Further, unless otherwise noted, the use of the words "approximate," "about," "around," "substantially," etc., mean plus or minus ten percent.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. An acoustic transducer microelectromechanical systems (MEMS) die comprising:
   an at least partially evacuated hermetically sealed cavity defined in part by
   a first diaphragm;

a backplate disposed at least partially within the cavity, wherein the first diaphragm is movable relative to the back plate in response to acoustic pressure; and
a pressure sensor coupled on the backplate or diaphragm and configured to sense pressure within the cavity.

2. The acoustic transducer of claim 1, wherein the at least partially evacuated hermetically sealed cavity is further defined by a second diaphragm spaced apart from the first diaphragm.

3. The acoustic transducer of claim 2, further comprising a first terminal electrically coupled to a first portion of the back plate or diaphragm, and a second terminal electrically coupled to a second portion of the back plate or diaphragm.

4. The acoustic transducer of claim 3, wherein the pressure sensor comprises a Pirani gauge formed on the back plate or diaphragm.

5. The acoustic transducer of claim 4, the Pirani gauge comprising a micro-beam resistor, electrically coupled to the first terminal and the second terminal, wherein the micro-beam resistor is suspended with respect to the back plate or diaphragm.

6. The acoustic transducer of claim 5, wherein the micro-beam resistor is configured to carry a bias current from the first terminal to the second terminal.

7. The acoustic transducer of claim 3, wherein the pressure sensor comprises an integrated resonator coupled to the back plate or diaphragm.

8. The acoustic transducer of claim 7, wherein the integrated resonator comprises a spring and a resonating member, wherein the spring is connected to the backplate or diaphragm and connected to an edge of the resonating member, wherein the spring suspends the resonating member with respect to the back plate or diaphragm.

9. The acoustic transducer of claim 8, the spring comprising:
a first spring interconnecting the back plate or diaphragm and a first portion of the resonating member;
a second spring interconnecting the back plate or diaphragm and a second portion of the resonating member; and
a third spring interconnecting the back plate or diaphragm and a third portion of the resonating member.

10. The acoustic transducer of claim 9, wherein the backplate defines an opening, wherein the resonating member is suspended within the opening.

11. A microphone assembly comprising:
a housing;
an acoustic transducer disposed within the housing and comprising:
an at least partially evacuated hermetically sealed cavity defined in part by a first diaphragm;
a backplate disposed at least partially within the cavity, wherein the first diaphragm is movable relative to the backplate in response to acoustic pressure; and
a pressure sensor coupled on the backplate and located within the cavity; and
an integrated circuit disposed within the housing, the integrated circuit comprising a pressure sensing circuit connected to the pressure sensor and configured to process an electrical signal from the pressure sensor to generate output data indicative of the pressure.

12. The microphone assembly of claim 11, wherein the at least partially evacuated hermetically sealed cavity is further defined by a second diaphragm spaced apart from the first diaphragm, wherein the backplate defines at least one aperture therethrough.

13. The microphone assembly of claim 12, wherein the pressure sensor comprises a Pirani gauge coupled to the backplate, the Pirani gauge comprising a micro-beam resistor, a first pad formed on the backplate, and a second pad formed on the backplate, wherein the micro-beam resistor is connected to the first pad and to the second pad and is suspended relative to the backplate.

14. The microphone assembly of claim 13, the pressure sensing circuit comprising a Wheatstone bridge and differential amplifier, the micro-beam resistor connected in a first leg of the Wheatstone bridge.

15. The microphone assembly of claim 12, wherein the pressure sensor comprises an integrated resonator coupled to the backplate, the integrated resonator comprising a spring and a resonating member, wherein the spring is connected the backplate and connected to an outer edge of the resonating member, and wherein the spring suspends the resonating member with respect to the backplate.

16. The microphone assembly of claim 15, the pressure sensing circuit comprising a swept frequency generator and a trans-impedance amplifier, an output of the swept frequency generator connected to an input of the integrated resonator, and the trans-impedance amplifier connected to an output of the integrated resonator.

17. The microphone assembly of claim 16, the pressure sensing circuit further comprising an analog to digital converter connected to an output of the trans-impedance amplifier, and the integrated circuit further comprising a processor configured to receive a signal from the analog to digital converter and detect a phase of the signal and a frequency indicative of the resonant frequency of the integrated resonator.

18. The microphone assembly of claim 17, wherein the integrated resonator has a resonant frequency dependent on the pressure in the cavity.

19. The microphone assembly of claim 18, wherein the integrated resonator has a range of resonant frequencies between 50 kiloHertz (kHz) and 150 kHz.

20. A microphone assembly comprising:
a housing;
an acoustic transducer disposed within the housing comprising:
an at least partially evacuated hermetically sealed cavity defined in part by a first diaphragm;
a backplate disposed at least partially within the cavity, the cavity having a pressure lower than atmospheric pressure; and
the backplate configured to sense the pressure within the cavity;
an integrated circuit disposed within the housing, the integrated circuit connected to the backplate, the integrated circuit comprising bias circuitry configured to selectively apply a bias voltage to the backplate or apply a sensing current to the backplate.

* * * * *